United States Patent
Cable et al.

(10) Patent No.: US 9,947,688 B2
(45) Date of Patent: Apr. 17, 2018

(54) INTEGRATED CIRCUITS WITH COMPONENTS ON BOTH SIDES OF A SELECTED SUBSTRATE AND METHODS OF FABRICATION

(75) Inventors: James S. Cable, Del Mar, CA (US); Anthony Mark Miscione, Ramona, CA (US); Ronald Eugene Reedy, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 678 days.

(21) Appl. No.: 13/528,832

(22) Filed: Jun. 20, 2012

(65) Prior Publication Data

US 2013/0154088 A1 Jun. 20, 2013

Related U.S. Application Data

(60) Provisional application No. 61/500,075, filed on Jun. 22, 2011.

(51) Int. Cl.
*H01L 21/00* (2006.01)
*H01L 21/36* (2006.01)
(Continued)

(52) U.S. Cl.
CPC ......... *H01L 27/1203* (2013.01); *H01L 21/78* (2013.01); *H01L 27/0694* (2013.01);
(Continued)

(58) Field of Classification Search
CPC . H01L 27/0694; H01L 27/1203; H01L 21/78; H01L 27/12
(Continued)

(56) References Cited

U.S. PATENT DOCUMENTS 5,426,072 A * 6/1995 Finnila ............ H01L 21/76898
257/686
6,071,754 A 6/2000 Wark
(Continued)

FOREIGN PATENT DOCUMENTS

EP 1608018 4/2008
EP 2128891 12/2009
(Continued)

OTHER PUBLICATIONS

Wirner, Christoph, Written Opinion received from the EPO dated Jul. 1, 2013 for related appln. No. PCT/US2012/043625, 14 pgs.
(Continued)

*Primary Examiner* — Joseph C Nicely
*Assistant Examiner* — Wilner Jean Baptiste
(74) *Attorney, Agent, or Firm* — Jaquez Land Greenhaus LLP; Martin J. Jacquez, Esq.; John Land, Esq.

(57) ABSTRACT

Novel integrated circuits (SOI ICs), and methods for making and mounting the ICs are disclosed. In one embodiment, an IC comprises a first circuit layer of the IC formed from an active layer of an SOI wafer. The first circuit layer is coupled to a first surface of buffer layer, and a second surface of the buffer layer is coupled to a selected substrate comprising an insulating material. The selected substrate may be selected, without limitation, from the following types: sapphire, quartz, silicon dioxide glass, piezoelectric materials, and ceramics. A second circuit layer of the IC are formed, coupled to a second surface of the selected substrate. In one embodiment of a mounted IC, the first circuit layer is coupled to contact pads on a package substrate via solder bumps or copper pillars. The second circuit layer is coupled to contact pads on the package substrate via wire bonds.

37 Claims, 17 Drawing Sheets

(51) Int. Cl.
*H01L 21/20* (2006.01)
*H01L 27/12* (2006.01)
*H01L 27/06* (2006.01)
*H01L 21/78* (2006.01)

(52) U.S. Cl.
CPC ............... *H01L 2224/0401* (2013.01); *H01L 2224/04042* (2013.01); *H01L 2224/11002* (2013.01); *H01L 2224/16227* (2013.01); *H01L 2224/48227* (2013.01); *H01L 2224/73257* (2013.01); *H01L 2224/94* (2013.01); *H01L 2924/15192* (2013.01)

(58) Field of Classification Search
USPC .................................................. 438/460, 479
See application file for complete search history.

(56) References Cited

U.S. PATENT DOCUMENTS

| | | | |
|---|---|---|---|
| 6,150,708 A | 11/2000 | Gardner et al. | |
| 6,214,733 B1 | 4/2001 | Sickmiller | |
| 6,424,034 B1 | 7/2002 | Ahn et al. | |
| 6,784,023 B2 | 8/2004 | Ball | |
| 6,821,826 B1* | 11/2004 | Chan et al. | 438/150 |
| 6,838,332 B1 | 1/2005 | Sanchez et al. | |
| 6,911,375 B2 | 6/2005 | Guarini et al. | |
| 2002/0096359 A1 | 7/2002 | Hsu et al. | |
| 2003/0173499 A1 | 9/2003 | Cole et al. | |
| 2004/0079941 A1 | 4/2004 | Yamazaki et al. | |
| 2005/0275017 A1* | 12/2005 | Pozder | H01L 21/8221 257/347 |
| 2006/0264004 A1 | 11/2006 | Tong et al. | |
| 2007/0029636 A1 | 2/2007 | Kanemaru et al. | |
| 2007/0105320 A1 | 5/2007 | Yang | |
| 2008/0121725 A1 | 5/2008 | Nomura | |
| 2008/0179678 A1 | 7/2008 | Dyer et al. | |
| 2008/0197436 A1 | 8/2008 | Uya | |
| 2008/0283995 A1 | 11/2008 | Bucki et al. | |
| 2009/0001600 A1 | 1/2009 | Somani | |
| 2009/0140300 A1* | 6/2009 | Usami | H01L 27/0688 257/288 |
| 2010/0044759 A1 | 2/2010 | Bernstein et al. | |
| 2010/0134993 A1* | 6/2010 | Ito | H03H 9/0552 361/764 |
| 2010/0140670 A1* | 6/2010 | Peczalski | B81C 1/00246 257/254 |
| 2010/0291749 A1* | 11/2010 | Or-Bach | G11C 17/14 438/401 |
| 2011/0012199 A1 | 1/2011 | Nygaard et al. | |
| 2011/0012223 A1* | 1/2011 | Molin | H01L 21/84 257/506 |
| 2011/0073983 A1 | 3/2011 | Tanida et al. | |
| 2011/0155429 A1* | 6/2011 | Lee | H05K 3/007 174/257 |
| 2012/0012957 A1* | 1/2012 | Larsen | G01T 3/08 257/429 |
| 2013/0154049 A1 | 6/2013 | Imthurn et al. | |

FOREIGN PATENT DOCUMENTS

| | | |
|---|---|---|
| JP | 1973017982 | 3/1973 |
| JP | 52 149076 | 12/1977 |
| JP | 60149146 | 8/1985 |
| JP | 1996181211 | 7/1996 |
| JP | 10095189 | 4/1998 |
| JP | 1998223495 | 8/1998 |
| JP | 1998229162 | 8/1998 |
| JP | 11214448 | 8/1999 |
| JP | 2001-127149 | 5/2001 |
| JP | 2001185685 | 7/2001 |
| JP | 2003163313 | 6/2003 |
| JP | 2007165693 | 6/2007 |
| JP | 2008198731 | 8/2008 |
| JP | 2008288345 | 11/2008 |
| JP | 2009 004519 | 1/2009 |
| JP | 2009004519 * | 8/2009 |
| JP | 2014523644 | 9/2014 |
| JP | 6076972 | 1/2017 |
| WO | WO2011008893 | 1/2011 |
| WO | WO2012177934 | 12/2012 |
| WO | WO2012177936 | 12/2012 |

OTHER PUBLICATIONS

Wirner, Christoph, Invitation to Restrict or Pay Additional Fees received from the EPO dated May 30, 2013 for related appln. No. PCT/US2012/043625, 3 pgs.

Fan, Su Jya, Office Action received from USPTO dated Jul. 16, 2013 for related U.S. Appl. No. 13/528,825, 54 pgs.

Peregrine Semiconductor Corporation, Demand for International Examination filed in the EPO dated Apr. 19, 2013 for related appln. No. PCT/US2012/043627, 21 pgs.

Peregrine Semiconductor Corporation, Demand for International Examination filed in the EPO dated Apr. 19, 2012 for related appln. No. PCT/US2012/043625, 35 pgs.

Bakvis, John, Invitation to Pay Additional Fees and, Where Applicable, Protest Fee received from the EPO dated Oct. 22, 2012 for related appln. No. PCT/US2012/043625, 8 pgs.

Matias Garraz, Bruno, International Search Report received from the EPO dated Dec. 21, 2012 for related appln. No. PCT/US2012/043625, 9 pgs.

Tadashige Itoh, et al., Office Action and English translation received from the JPO dated Aug. 9, 2016 for appln. No. 2014-517185, 28 pgs.

Peregrine Semiconductor Corporation, Response and English translation of Response filed in the JPO dated Oct. 14, 2016 for appln. No. 2014-517185, 28 pgs.

Peregrine Semiconductor Corporation, Response and English translation filed in the JPO dated Jan. 31, 2017 for appln. No. 2017-002565, 7 pgs.

Bakvis, John, "International Preliminary Report on Patentability" received from the EPO dated May 30, 2013 for related appln. No. US2012/043627, 6 pgs.

Bakvis, John, "International Preliminary Report on Patentability" received from the EPO dated Sep. 9, 2013 for related appln. No. US2012/043625, 6 pgs.

Peregrine Semiconductor Corporation, Response filed in the EPO dated Aug. 29, 2013 for related appln. No. PCT/US2012/043625, 22 pgs.

Itoh, Tadashige, et al., English translation of Office Action received from the JPO dated Dec. 19, 2017 for appl. No. 2017-002565, 5 pgs.

* cited by examiner

INTEGRATED CIRCUITS WITH COMPONENTS ON BOTH SIDES OF A SELECTED SUBSTRATE AND METHODS OF FABRICATION

CROSS-REFERENCE TO RELATED APPLICATION—CLAIM OF PRIORITY

This patent application claims the benefit of priority under 35 U.S.C. § 119 (e) to commonly-assigned U.S. Provisional Patent Application 61/500,075, filed Jun. 22, 2011, entitled "Integrated Circuits with Components on Both Sides of a Selected Substrate and Methods of Fabrication". The above-cited provisional patent application is hereby incorporated by reference herein in its entirety as if set forth in full.

BACKGROUND

1. Field

The present disclosure relates to electronic integrated circuits (ICs), and more specifically to Silicon on Insulator (SOI) ICs.

2. Description of Related Art

Reducing the size of ICs is important for improving economy of fabrication and packaging. Also, for some applications, such as RF ICs for wireless mobile units, the ICs must be small because the unit in which they are incorporated is small, and the space available for the ICs is constrained. However, reducing the size of ICs can be difficult for various reasons. For regions of an IC comprising primarily active components (e.g., transistors), for example, heat dissipation from the IC is made more difficult because the area for thermal coupling is reduced. For regions of an IC comprising primarily passive components (such as capacitors and inductors), the inherent size of the components is related to physical principles, and reducing their size is difficult to achieve.

For RF circuits (such as RF power amplifiers (PAs) and RF switches), the space required for passive components can be a major contribution to the overall size of the circuit because RF circuits frequently require RF filters and/or resonators, which have large passive elements. Typically, more than half the area of an RF circuit is allocated to such passive components. A further problem is presented by the placement of passive components. In some implementations, the passive components are placed "off-chip" (i.e., circuit components that are separate from the RF ICs comprising the active components) because it is not practical to integrate the passive components on-chip for reasons relating to component size, efficient signal coupling, or other considerations. In other implementations, the passive components are placed on-chip in regions of the IC that are separate from the active switching components. In either case, a relatively large IC area is required for the passive components, and achieving efficient RF signal coupling between the active and passive components is difficult because of parasitic impedances associated with interconnects and requirements for impedance matching for signals conveyed between the active and passive components.

According to prior art techniques, a method for reducing the size of ICs is to vertically stack one or more layers of IC components. For example, first IC components may be fabricated on a substrate, and a second layer of IC components may be fabricated on top of the first IC layer, wherein the component layers are separated by an insulating layer, and electrically connected using vias (i.e., holes filled with conductive material) that pass through the insulating layer. However, for RF ICs in particular, the stacking approach has many limitations. For example, using vias for electrical interconnects may be difficult to implement for RF ICs because of impedance matching and parasitic losses associated with the vias. Another problem is presented by the processes for producing stacked ICs because these processes involve non-standard IC processing steps. This results in reduced yields and increased costs of production.

The added layers in stacked ICs also reduce thermal conductivity, and removing heat generated by active devices is thereby impeded. Also, further IC layer stacking may increase the thickness of the ICs sufficiently to preclude use in systems requiring low package profiles.

For reasons well known to persons skilled in the arts of RF IC design, RF ICs may be advantageously implemented using silicon-on-insulator (SOI) technology. For some applications, SOI RF ICs may be fabricated on commercially available SOI wafers comprising a silicon substrate, a buffer layer (typically a buried-oxide (BOX) silicon dioxide layer) bonded to the substrate, and a thin silicon layer (referred to herein as the "active layer") on top of the buffer layer. Devices such as transistors may be fabricated in the active layer, and the buffer layer provides electrical isolation between IC components. However, because the buffer layer is relatively thin (with a typical thickness less than a micrometer), capacitive coupling of RF signals between devices in the active layer and the conductive silicon substrate may cause poor performance for many types RF ICs. For these purposes, replacing the silicon substrate with a fully insulating substrate may be advantageous. The limitations discussed above with respect to reducing the size of RF ICs in general also relate specifically to SOI RF ICs.

Some exemplary limitations of prior art are presented in the following reference: U.S. patent application Ser. No. 12/612,957, Kerry Bernstein, et al., entitled "Double-Sided Integrated Circuit Chips," published Feb. 25, 2010 as U.S. Publication No. 2010/0044759 A1. U.S. application Ser. No. 12/612,957 (hereby incorporated herein as if set forth in full) teaches an IC structure and fabrication method wherein two SOI ICs are fabricated separately on SOI wafers having BOX layers. The two SOI ICs are thinned to expose the BOX layers, and bonded back-to-back by joining the BOX layers. The two circuits of the two SOI ICs are electrically coupled together using vias formed through the BOX layers. One limitation of the referenced teachings is that the composition of the layer that separates the two circuits is constrained to be silicon dioxide, which comprises the BOX layers. Silicon dioxide has poor thermal conductivity, and other materials would provide superior performance especially for RF power amplifier or switching circuits. Another limitation of the prior art teachings results from the expensive methods required to align and fabricate the vias. A further limitation of the prior art teachings is that circuit failure and malfunction may occur due to faulty vias.

The present teachings disclose novel ICs, and fabrication methods that overcome limitations of prior art by reducing IC areas and thicknesses, improving IC performance, and providing efficient and economical methods of fabrication.

SUMMARY

Novel integrated circuits (ICs), and methods of fabrication are disclosed.

In one embodiment, an IC comprises a first circuit layer of the IC formed from an active layer of an SOI wafer. The first circuit layer is coupled to a first surface of a buffer layer, and a second surface of the buffer layer is coupled to a selected substrate comprising an insulating material. The selected substrate may be selected, without limitation, from the following types: sapphire, quartz, silicon dioxide glass, piezoelectric materials, and other ceramics. A second circuit layer of the IC is formed on and coupled to a second surface of the selected substrate. The first circuit layer may be referred to as a "front side" of the IC, and the second surface components may be referred to as a "back side" of the IC.

In an embodiment of a mounted IC, the first circuit layer is coupled to a first contact pad disposed on a package substrate by means of a contact element such as a solder ball or copper pillar. The second circuit layer is coupled to a second contact pad disposed on the package substrate by means of a wire bond or by other means. The first and second contact pads are operably coupled together by an interconnect disposed on the substrate package, thereby operably coupling together the first circuit layer and the second circuit layer. Other contact pads on the package substrate may be coupled to other contact elements that are coupled to the first circuit, and/or to interconnects for other components, such as signal inputs/outputs or power sources. These other components may be disposed as separate elements on the package substrate, or disposed externally to the package substrate. Likewise, other contact pads may be coupled to wire bonds that are coupled to the second circuit layer, and/or to interconnects for other components. In alternative embodiments, other packaging means, and contacting means other than wire bonds, may be employed. For example, embedded die packaging, and/or via interconnects, may be employed.

In some embodiments, the ICs comprise RF amplifiers, RF switches, or a combination thereof. In various embodiments, the first and/or second circuit layers of the ICs may comprise, without limitation: RF circuits, amplifier circuits, switching circuits, digital circuits, filter circuits, resonator circuits, circuits including acoustic wave components, and microelectromechanical systems (MEMS) components.

A method of making ICs includes forming the first circuit layer from an active layer of an SOI wafer, wherein the SOI wafer comprises the active layer, a buffer layer coupled to the active layer, and a silicon substrate coupled to the buffer layer. After forming the first circuit layer, the silicon substrate is removed from the buffer layer and the buffer layer is coupled to a first surface of the selected substrate. In alternative embodiments, the first circuit layer may be formed on an active layer formed on a sapphire substrate, such as a silicon layer coupled to a sapphire substrate. The selected substrate is optionally thinned to a selected thickness. The second circuit layer of the ICs is formed, coupled to a second surface the selected substrate. Methods for making the ICs generally include forming contact elements on the ICs, and separating the ICs by dicing.

In some embodiments, the second circuit layer may be formed on another substrate (e.g., another SOI wafer, a silicon wafer having an insulating surface layer, or a piezoelectric substrate). Subsequently, the other substrate is optionally thinned or removed, and the second circuit layer is transferred and coupled to the second surface of the selected substrate.

Further embodiments may include forming the first circuit layer from an active layer of an SOI wafer, wherein the SOI wafer comprises the active layer, a buffer layer coupled to the active layer, and a silicon substrate coupled to the buffer layer. After forming the first circuit layer, the silicon substrate is removed from the buffer layer. Independently, the second circuit layer of the ICs is formed. The second circuit layer may be formed directly on the second surface the selected substrate. Alternatively, the second circuit layer may be formed on another substrate, then transferred and coupled to the second surface of the selected substrate. Subsequently, the selected substrate is optionally thinned to a selected thickness, and the buffer layer is coupled to the first surface of the selected substrate.

An exemplary embodiment of an IC in accordance with the present invention, including RF power amplifiers and an RF switch, is disclosed.

BRIEF DESCRIPTION OF THE DRAWINGS

Like reference numbers and designations in the various drawings indicate like elements.

DETAILED DESCRIPTION

Figure 1:
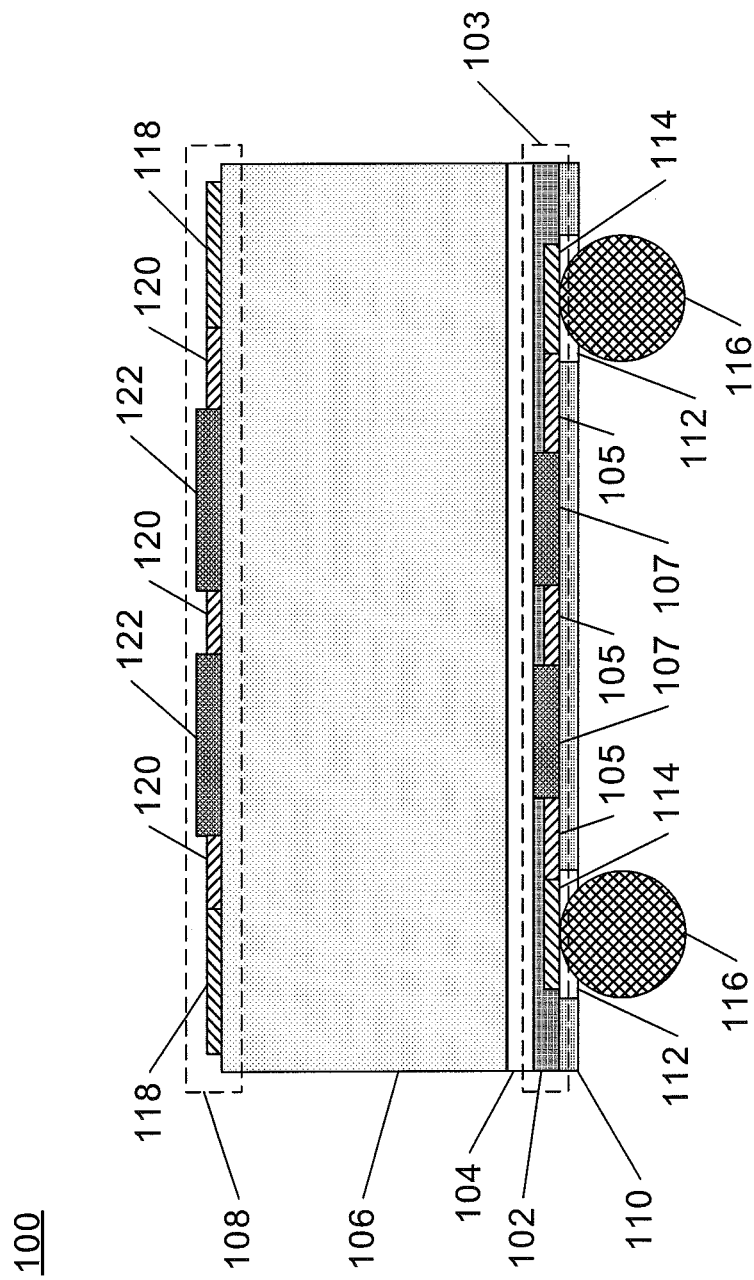
FIG. 1 schematically illustrates a cross-section of an IC formed according to the present teachings.

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present teachings disclose novel ICs wherein IC components are disposed on both sides of a selected substrate, comprising an insulating material. One advantage of the inventive concept is that the selected substrate may be selected from a plurality of insulating substrate materials. In one example, the selected substrate layer may comprise sapphire. As is known to persons skilled in the art of RF IC design, a sapphire substrate provides excellent electronic and thermal properties for RF ICs. The present teachings include a method of fabricating improved ICs.

Example embodiments disclosed herein include the following: a structure or general embodiment of integrated circuits (ICs) that may be implemented in a plurality of types of ICs; an embodiment of mounted ICs; a method for fabricating the ICs; and examples of types of ICs in accordance with the inventive concept. In one embodiment, the ICs comprise silicon-on-insulator (SOI) ICs. Although the scope of the present disclosed method and apparatus are not limited to SOI ICs, embodiments of SOI ICs in accordance with the present teachings are provided as examples.

SOI ICs are used in many exemplary applications because the insulating layer positioned below the semiconductor layer improves electrical isolation between the components of the IC. This is important for applications such as radiation-resistant ICs and radio-frequency (RF) ICs. For some applications it is sufficient for the insulating layer to be relatively thin. For example, the insulating layer may comprise a buffer layer comprising a buried-oxide silicon dioxide layer (referred to as a "BOX layer"), which is typically less than a micrometer in thickness. In some exemplary embodiments, the buffer layer is disposed between a thin silicon layer (also referred to as the "active layer" in which active devices are fabricated) and a silicon substrate. The buffer layer may provide an "etch stop" (i.e., wherein a processing step that includes etching stops at the buffer layer, thereby protecting the active layer). The buffer layer may also serve to prevent chemical and/or mechanical damage to the active layer. SOI wafers having an active layer, a BOX layer, and a silicon substrate are commercially available. Although SIMOX wafers may be employed in accordance with the present teachings, wafers wherein a monocrystalline silicon active layer is bonded to an insulating buffer layer (such as a BOX layer) may provide improved performance in some applications. For some applications (e.g., RF power amplifiers (PAs) and RF switches) it is desirable to have an insulating layer that is much thicker than the BOX layer. This may be implemented by using an insulating substrate instead of a silicon substrate. Silicon-on-sapphire (SOS) ICs are an example wherein the substrate is insulating. An advantage of implementing such an insulating substrate is that it may be selected to have improved an improved thermal conductivity over the thermal conductivity of a BOX layer. For example, by selecting sapphire or a selected ceramic material rather than silicon dioxide as an insulating substrate, improved thermal conductivity may be obtained.

For systems comprising RF ICs, passive components may occupy a significant area (or IC real estate) of the system. An advantage of the present teachings is that the area (or "real estate") of a system devoted to passive components can be greatly reduced. As used herein, that term "passive components" refers to circuit elements that passively impede or store electrical signals (e.g., resistors, capacitors and inductors). The term "active components" as used herein, refers primarily to elements that modulate, amplify or switch electrical signals, such as transistors. Although resistors can generate heat, most heat production in an IC is generated by active components. The heat generated by capacitors and inductors is generally negligible. Another advantage of the present methods and apparatus is that active components may be disposed so that heat removal is efficiently implemented, while passive components may be disposed so that efficient electrical coupling (e.g., impedance matching and/or tuning) may be implemented. A further advantage of the present teachings is that the electronic performance of the active and passive circuits is improved by removing the silicon substrate and implementing an insulating substrate, thereby preventing electrical coupling and dissipation via the silicon substrate.

IC Structure

FIG. 1 is a diagram illustrating a cross-section of an IC 100, in accordance with the present teachings. An active layer 102 comprises a semiconductor layer (e.g., a silicon layer derived from the active layer of an SOI wafer). Circuit components 107, interconnects 105, and contacts 114 are fabricated within and on the active layer 102 according to fabrication methods described hereinbelow in reference to a FIG. 3, et al. The plurality of circuit components 107, interconnects 105, and contacts 114 shown in FIG. 1 are illustrative only, and any plurality of each may be employed. The circuit components 107 may comprise active and/or passive components. The circuit components 107, interconnects 105, and contacts 114 are electrically coupled together to comprise a first circuit 103 (the first circuit 103 is equivalently referred to herein as a "first circuit layer") of the IC 100. In some embodiments, the first circuit 103 of the IC 100 may provide switching and amplification functions for RF ICs such as RF power amplifiers (PAs) and RF switches. However, those skilled in the IC fabrication arts shall recognize that the present disclosure is not so limited.

Optionally, a cap layer 110 may be coupled to a first surface of the active layer 102. The cap layer 110 may comprise a passivation layer, and may comprise, without limitation: a silicon nitride layer, a silicon oxide layer, a phosphorus silicon glass layer, an organic layer, or any combination thereof. In some embodiments, the optional cap layer 110 may be not included. In the exemplary embodiment, holes 112 in the cap layer 110 enable electrical and/or thermal coupling with the contacts 114. Contact elements 116 are operably coupled to the contacts 114. In some embodiments, the contact elements 116 may include solder bumps. In other embodiments, conductive pillars (e.g., copper pillars) or other types of contact elements 116 may be employed. Examples of contact elements 116 include, without limitation: solder bumps and copper pillars. According to one example, the means whereby the contact elements 116 are operably coupled to the contacts 114 includes flip-chip mounting. Flip-chip mounting is a method well known to persons skilled in the arts of IC manufacture.

A first surface of a buffer layer 104 is bonded to a second surface of the active layer 102. In some embodiments the buffer layer 104 may be a BOX layer. The buffer layer 104 structurally supports, and provides electrical isolation between the circuit components fabricated within and on the active layer 102.

A second surface of the buffer layer 104 is bonded to a first surface of the substrate 106. In some embodiments, the buffer layer 104 may be not included. In embodiments wherein the buffer layer 104 is not present, the active layer 102 may be coupled directly to the first surface of the substrate 106.

One advantage of the present methods and apparatus is that the substrate 106 may be selected from a plurality of substrates. For example, the substrate 106 may selected, without limitation, from the following types of material: sapphire, quartz, silicon dioxide glass, a piezoelectric material, silicon carbide (SiC) formed by chemical vapor deposition (CVD SiC), and a ceramic material. The ceramic material may be selected, without limitation, from the following ceramic forms of the following materials: aluminum nitride (AlN), silicon carbide, and alumina ($Al_2O_3$). Another advantage of the present methods and apparatus is that a thickness of the substrate 106 may be selected to satisfy requirements such as a need for low-profile packaging. As an example, the thickness of the selected substrate 106 may be selected from a range of 10 to 1000 micrometers. A fabrication method to enable selecting the type and thickness of the substrate 106 is described hereinbelow in a sub-section titled "Method of Fabrication."

Referring again to FIG. 1, a second circuit 108 (the second circuit 108 is also referred to herein as a "second circuit layer") of the IC 100 is coupled to a second surface of the substrate 106. The second circuit 108 includes contacts 118, interconnects 120, and components 122. The components 122 may comprise passive and/or active components. The plurality of contacts 118, interconnects 120, and components 122 shown in the FIG. 1 are illustrative only, and any number of each may be employed in specific embodiments. The contacts 118, the components 122, and the interconnects 120 are electrically coupled together in some embodiments. In some embodiments, the components 122 may include capacitors and/or inductors, electrically coupled together to implement resonators and/or filters for RF ICs such as RF PAs and RF switches. In some embodiments, the components 122 may include acoustic wave components (such as acoustic wave filters) thereby implementing signal processing functions. For example, acoustic wave components may include Surface Acoustic Wave (SAW) devices and/or Bulk Acoustic Wave (BAW) devices. Acoustic wave components, SAW devices, and BAW devices are well known to persons skilled in the arts of RF IC fabrication. In further embodiments, the components 122 may include microelectromechanical systems (MEMS) components. In general, the components 122 may comprise, without limitation: active devices, passive devices, acoustic wave devices, and MEMS devices. The second circuit 108 of the IC 100 may include, without limitation: RF circuits, digital circuits, filter circuits, resonator circuits, opto-electronic devices, acoustic wave devices, and MEMS devices.

The contacts 118 provide electrical and/or thermal contacts for the second circuit 108. In one example, the contacts 118 are coupled to wire bonds. An example of means for contacting the contacts 118 will be described with reference to a FIG. 2 in the sub-section titled "Mounted ICs".

The first circuit 103 of the SOI IC 100 and the second circuit 108 of the SOI IC 100 may be electrically coupled together according to teachings hereinbelow with reference to FIG. 2.

Mounted ICs

Figure 2:
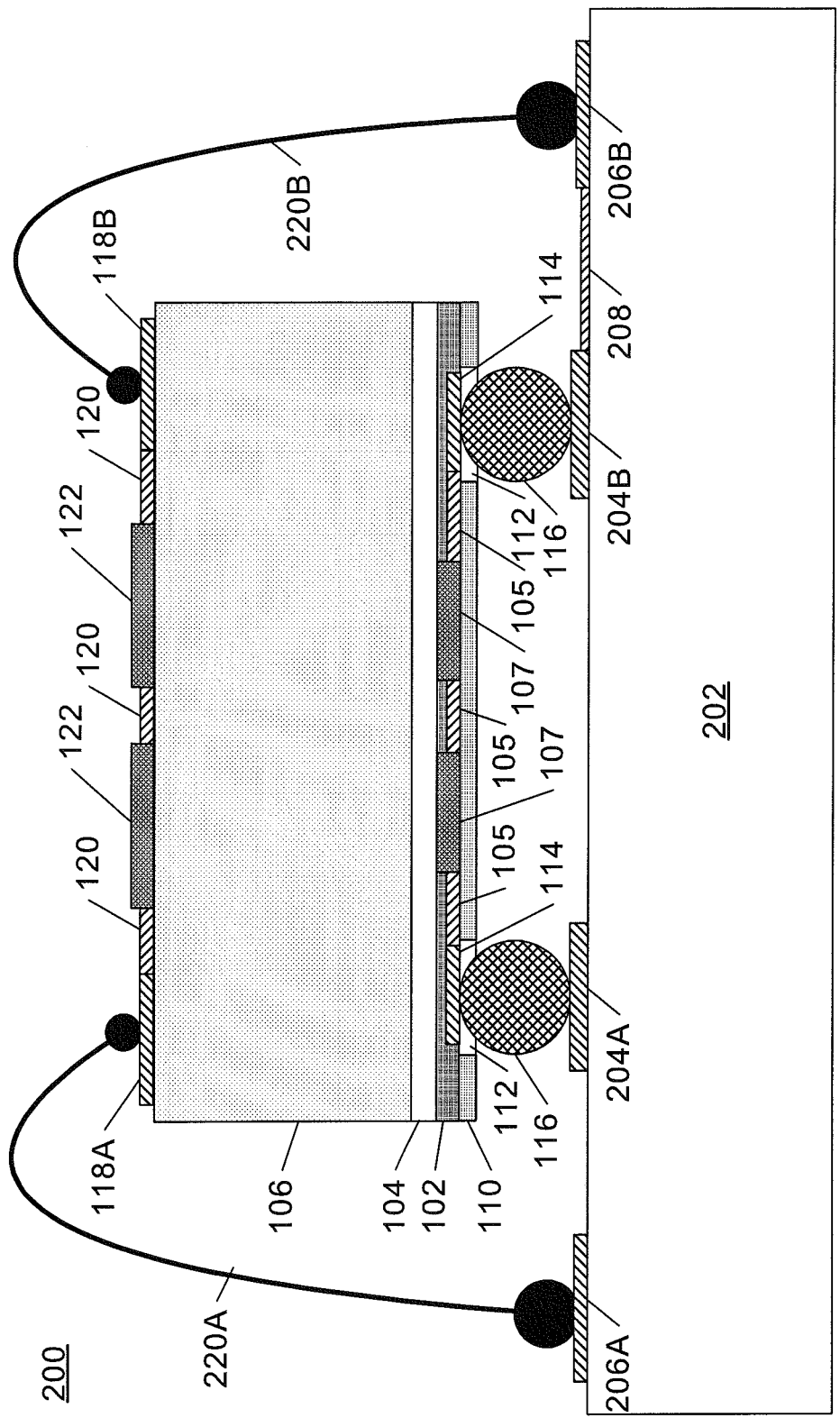
FIG. 2 schematically illustrates a cross-section of a mounted IC in accordance with the present teachings.

FIG. 2 is a schematic diagram of a cross-section of a mounted IC 200 in accordance with the present methods and apparatus. Contacts 204A, 204B, 206A, 206B, and interconnects 208 are bonded to a package substrate 202. The package substrate 202 includes an insulating material. For example, the package substrate 202 may include, without limitation, the following materials: plastics, ceramics, glasses, quartz, sapphire, and amorphous $Al_2O_3$. In some embodiments, the package substrate 202 may comprise a part of an IC package whereon a single IC or a plurality of ICs are mounted. In other embodiments, the package substrate 202 may comprise a part of a circuit board whereon a plurality of ICs are mounted and electrically coupled together. For example, a receiver and/or transmitter for a wireless mobile device may be implemented using a plurality of ICs on the package substrate 202.

For simplicity, FIG. 2 shows single instances of each of the following: the contacts 118A, 118B, 204A, 204B, 206A, 206B; wire bonds 220A and 220B; and interconnects 208. It shall be understood that any plurality of each may be included in the embodiments as described herein.

In some embodiments, the contacts 204A and 206A may be electrically coupled to external components (e.g., ICs, antennas, power sources, not shown) by means of package interconnects (not shown) in order to convey signals, bias voltages, etc.

The contacts 204A and 204B are coupled to the contact elements 116 in order to convey electrical signals, voltages, thermal energy, etc. As described above with reference to FIG. 1, in some embodiments, the contact elements 116 may include solder bumps. In other embodiments, conductive pillars (e.g., copper pillars) or other types of contact elements may be employed. Because the contacts 204A, as described above, may also be connected to external components (not shown), the first circuit 103 of the IC 100 (shown in the FIG. 1) may similarly be operably coupled to the external components to provide input and output signals and voltages.

The contacts 206A are electrically coupled to the wire bonds 220A. The wire bonds 220A are also electrically coupled to the contacts 118A. Because the contacts 206A may also be connected to external components (not shown), the second circuit 108 of the IC 100 (shown in the FIG. 1) may similarly be electrically coupled to the external components to provide input and output signals and voltages. The contacts 204B, the interconnects 208 the contacts 206B, the wire bonds 220B, and the contacts 118B are electrically coupled together thereby coupling the first circuit 103 and the second circuit 108 of the IC 100 (as shown in the FIG. 1).

Those skilled in the arts of RF system engineering design and fabrication will recognize and understand an advantage of the present teachings relating to implementation of the mounted IC 200 in an RF system. For RF systems that require a high degree of tuning between circuit components, wire bonds may be utilized to provide impedance matching between the circuit components. Likewise, according to the present methods and apparatus, the wire bonds 220A and 220B may be adapted to provide impedance matching between the second circuit of the IC 100 and other circuit components (e.g., external input/output circuits, and/or the first circuit of the IC 100). The wire bonds 220A and 220B exhibit significant impedances at RF frequencies. The impedances may be selectively adapted by modifying parameters such as the plurality, the lengths, and the diameters of the wire bonds 220A and 220B. In some embodiments, the wire bonds 220A, 220B, as illustrated in FIG. 2, may each comprise a plurality of wire bonds (not shown). The methods for RF tuning using wire bonds are well understood by persons skilled in the RF design arts. Accordingly, the present disclosure teaches an apparatus and method for efficient RF coupling between the impedance of the second circuit of the SOI IC 100 and other circuit components of an RF system.

Another advantage of the present methods and apparatus is provided because active components may be advantageously disposed in the first circuit 103 of the IC 100 (shown in the FIG. 1) for the removal of thermal energy and passive components may be conveniently disposed in the second circuit 108 of the IC 100. Active components are a principal source of thermal energy, and the contact elements 116 provide an effective means for removing thermal energy from the circuit. Therefore, disposing active components in proximity to the contact elements 116 provides a means for efficient heat removal via the contact elements 116 to the package substrate 202.

Persons skilled in the arts of IC fabrication and packaging will understand that the scope of the present teachings encompasses alternative embodiments, not shown, wherein alternative means for electrically coupling the first circuit 103 and the second circuit 108 are employed. For example, vias may be used to provide electrical coupling between the first circuit 103 and the second circuit 108. Further, the present teachings also encompass alternative mounting and packaging methods and structures. In one example, the well known embedded die packaging method may be employed.

Method of Fabrication

It will be understood by persons skilled in the IC design and fabrication arts that hundreds of intermediate steps may be required to form ICs. Further, conventional IC processing steps such as photolithography, masking, etching, mask stripping, ion implantation, and deposition of metal layers, dielectric layers, etc., are well known to persons skilled in the arts of IC manufacturing, and they will understand where such steps may be required. Therefore, only steps relevant to the inventive methods and apparatus are described in detail herein.

Figure 3:
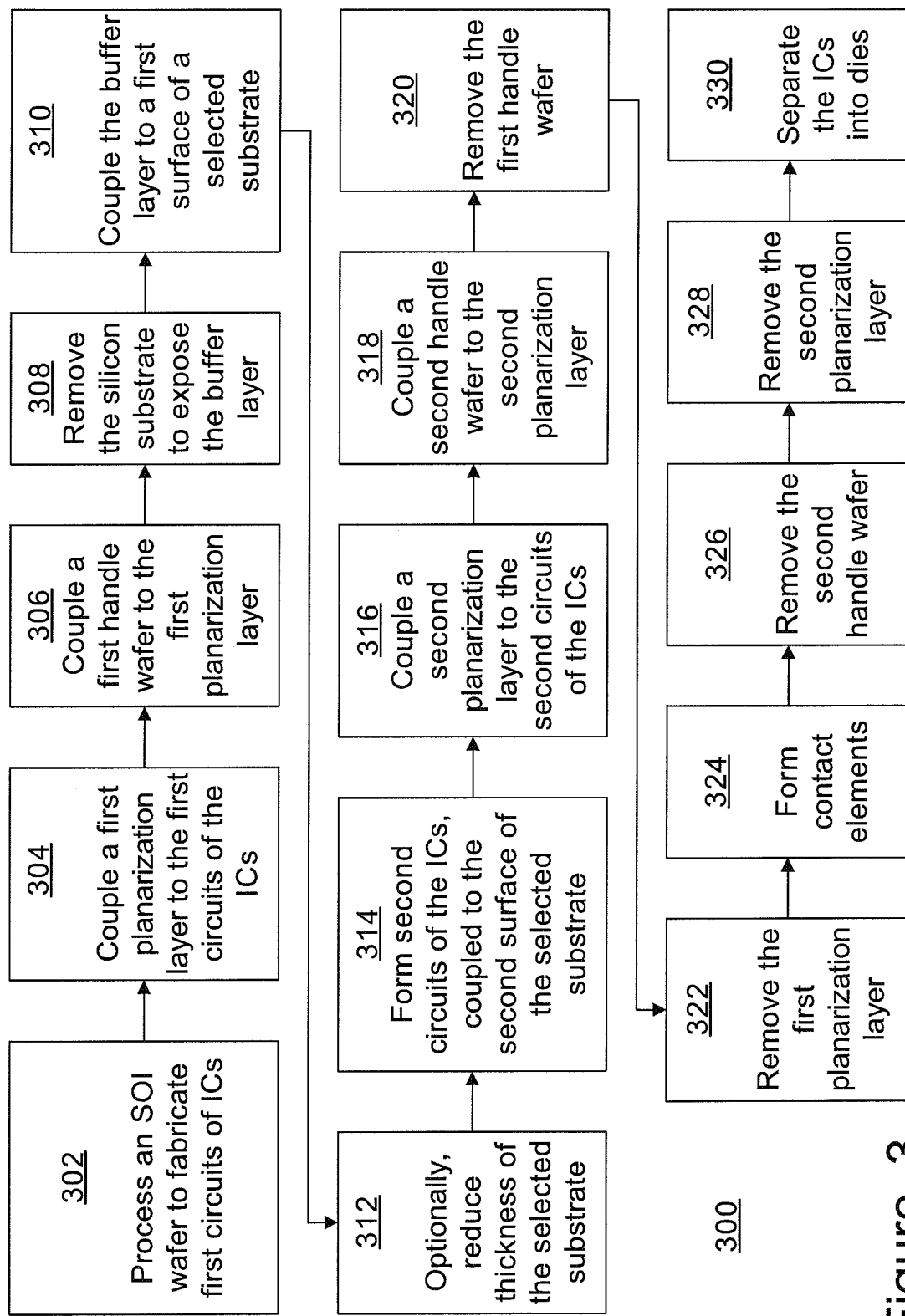
FIG. 3 is a flow-chart showing a disclosed method of forming ICs according to the present teachings.
Figure 4:
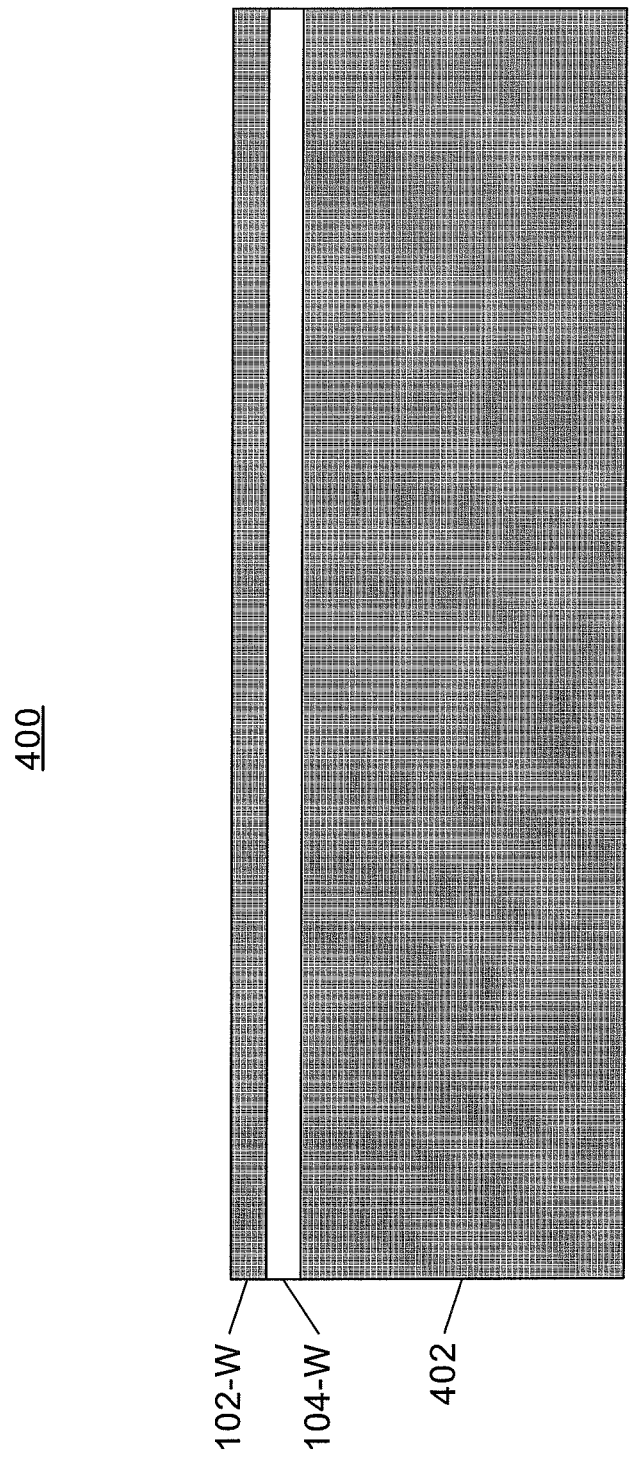
FIG. 4 schematically illustrates a cross-section of an SOI wafer to be processed according to the present disclosure.

According to one embodiment, FIG. 3 shows a flow-chart diagram of a first method 300 for forming or fabricating ICs such as the IC 100 of FIG. 1. FIG. 4 illustrates a commercial SOI wafer 400 suitable for processing according to the method 300. The SOI wafer 400 includes a silicon substrate 402, a buffer layer 104-W, and an active layer 102-W. (the "-W" suffix designates in-process wafer layers relating to like-numbered elements without the "-W" suffix shown in the FIGS. 1 and 2.)

Referring concurrently to both FIGS. 3 and 4, the method 300 begins at a STEP 302 wherein the active layer 102-W is processed to form a plurality of first circuits of the ICs, similar to the first circuit 103 (also referred to herein as the "first circuit layer") of the IC 100 shown in FIG. 1.

Proceeding to a STEP 304, a planarization layer 502 (shown in FIG. 5) is formed on the active layer 102-W.

Figure 5:
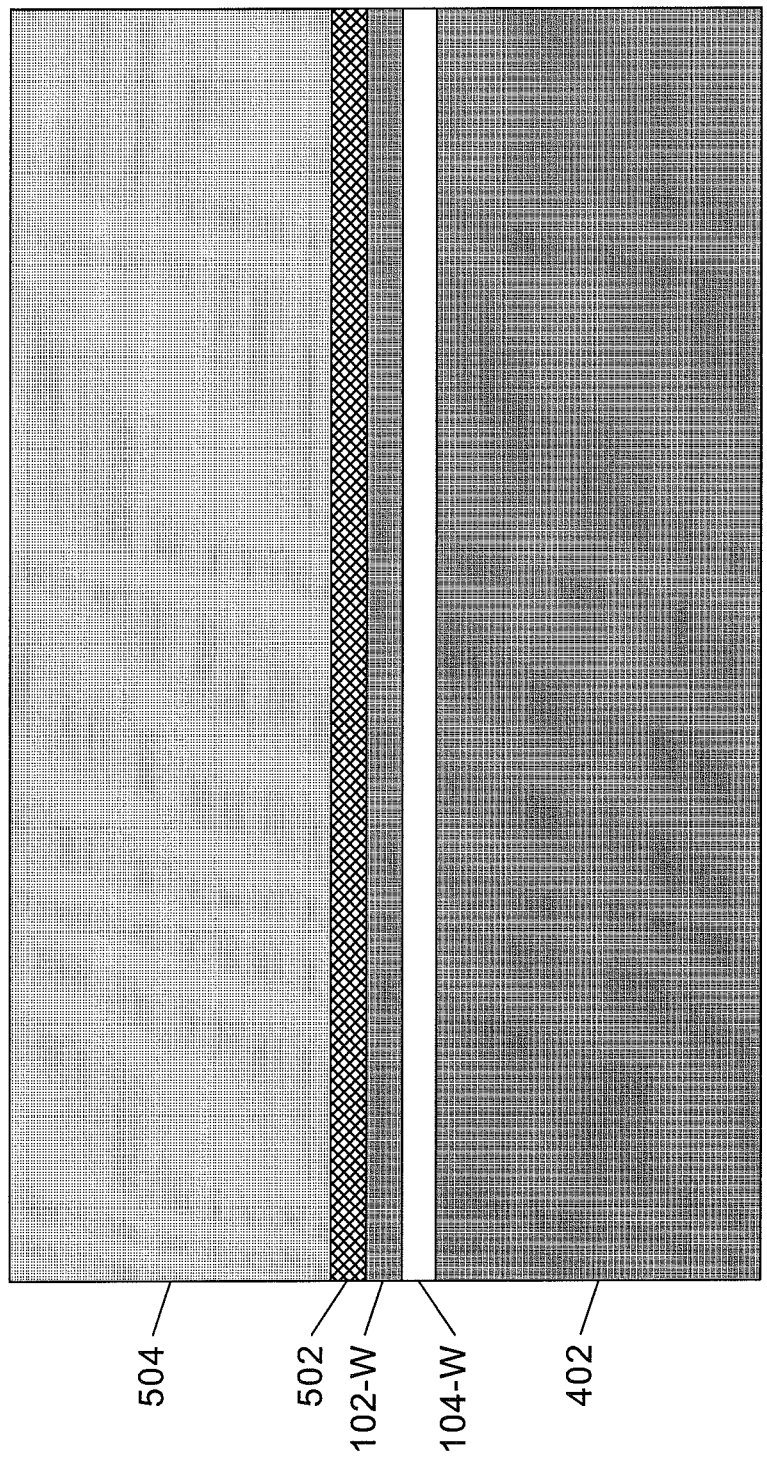
FIG. 5 schematically illustrates a cross-section of an in-process configuration of wafer layers processed according to the present disclosure.

At a next STEP 306, a first handle wafer 504 is coupled or bonded to the first planarization layer 502. FIG. 5 shows a layer configuration 500 at the completion of the STEP 306. In one example, the first planarization layer 502 may comprise polymer material applied by a spin-on method or other known method of manufacture. In another example, the first planarization layer 502 may comprise an oxide layer that is deposited and polished to provide a surface suitable for the well known direct bonding method, adhesive bonding, or other bonding methods. The first handle wafer 504 may comprise, without limitation: a silicon wafer, a sapphire wafer, a quartz wafer, or a glass wafer. The first handle layer 504 may be coupled or bonded to the first planarization layer 502 by means of an adhesive (e.g., a UV-release adhesive), by means of direct bonding, or by means of other bonding methods that are well known to persons skilled in the arts of IC fabrication.

At a next STEP 308, the silicon substrate 402 (FIG. 4) is removed. The silicon material may be removed by etching, mechanical polishing, grinding, or any combination thereof. Methods for thinning or removing silicon layers are well known to persons skilled in the IC manufacturing arts. The buffer layer 104-W has a first surface and a second surface. The first surface of the buffer layer 104-W is the surface that is coupled to the active layer 102-W. At the completion of the STEP 308, the second surface of the buffer layer 104-W is exposed.

Figure 6:
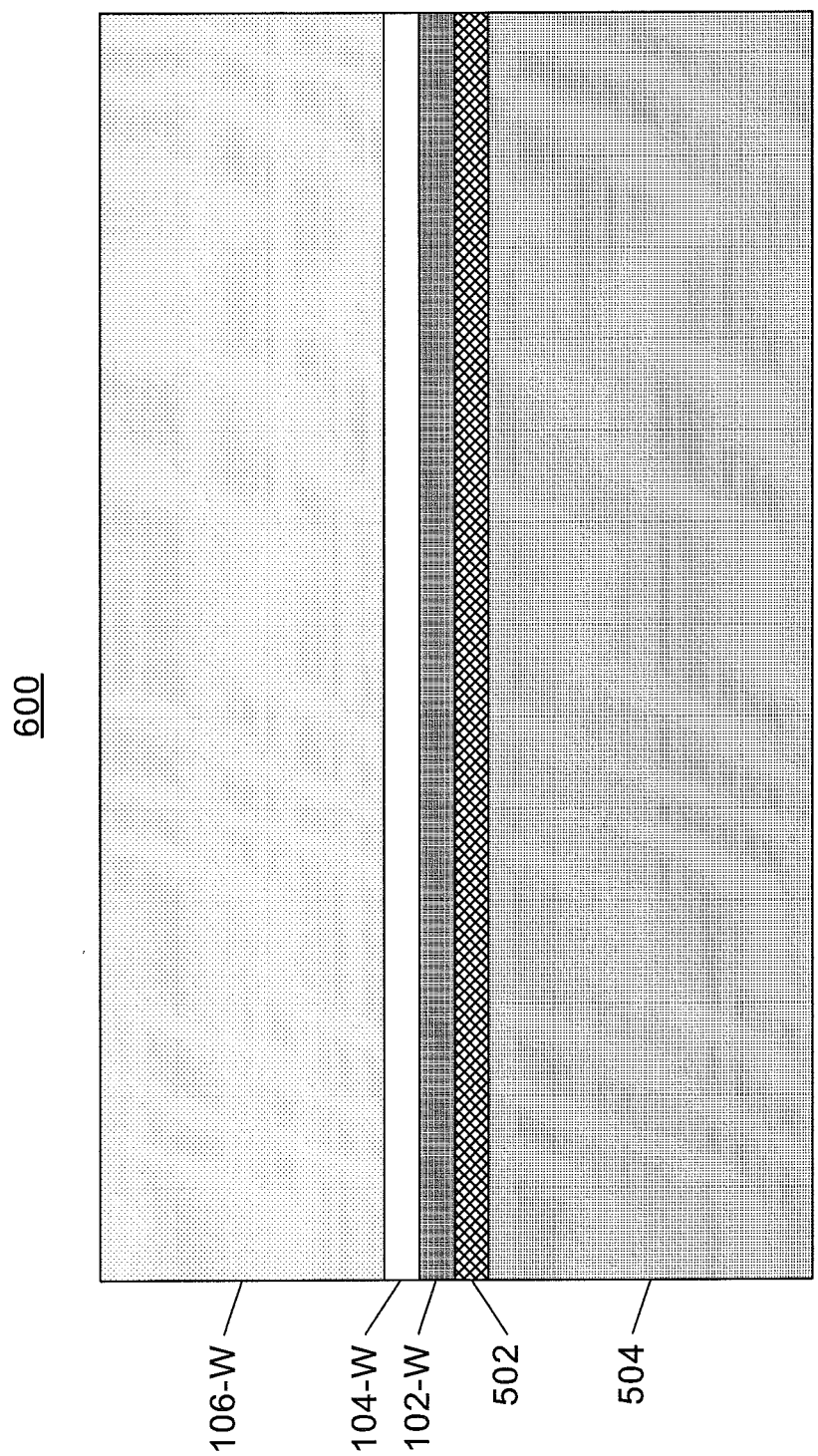
FIG. 6 schematically illustrates a cross-section of another in-process configuration of wafer layers processed according to the present disclosure.

At a next STEP 310, the second surface of the buffer layer 104-W is coupled to a first surface of a selected substrate 106-W (shown in FIG. 6). The coupling may be effected by an adhesive, by means of direct bonding, or by other methods that are well known to persons skilled in the arts of IC fabrication. The selected substrate 106-W may comprise, without limitation, one of the following types: sapphire, quartz, silicon dioxide glass, aluminum nitride, hot-pressed silicon carbide ceramic, sintered silicon carbide ceramic, CVD silicon carbide, and alumina. In some embodiments, the selected substrate 106-W may comprise a piezoelectric material whereon acoustic wave devices may be formed. Methods for bonding a silicon device layer having a silicon dioxide buffer layer to a sapphire wafer are described in a U.S. Pat. No. 6,911,375, issued Jun. 28, 2005, entitled "Method of Fabricating Silicon Devices on Sapphire with Wafer Bonding at Low Temperature," inventors K. Guarini, et al. U.S. Pat. No. 6,911,375 is hereby fully incorporated by reference herein, as though set forth in full, for its teachings on coupling a silicon device layer to a sapphire substrate. Methods for bonding a silicon device layer having a silicon dioxide buffer layer to ceramic substrates are described in U.S. Provisional Patent Application 61/500,069, filed Jun. 22, 2011, entitled "Integrated Circuits on Ceramic Wafers Using Layer Transfer Technology," inventors G. Imthurn, et al. U.S. Provisional Patent Application 61/500,069 is hereby fully incorporated by reference herein, as though set forth in full, for its teachings on coupling a silicon device layer to ceramic substrates.

FIG. 6 shows a layer configuration 600 at the completion of a next STEP 312. Note that the layer configuration 600 is rotated by 180 degrees relative to the layer configuration 500 of the FIG. 5. At a STEP 312, the thickness of the selected substrate 106-W is reduced to a selected thickness. The thickness of the selected substrate 106-W may be reduced by etching, mechanical polishing, grinding, or a by combination thereof. In one example, the selected thickness may be selected from the range of 10 to 1000 micrometers. In some embodiments, the STEP 312 may be optionally omitted, as, for example, if the thickness of the selected substrate 106-W already has a desired thickness when coupled to the second surface of the buffer layer 104-W at the STEP 310.

Figure 7:
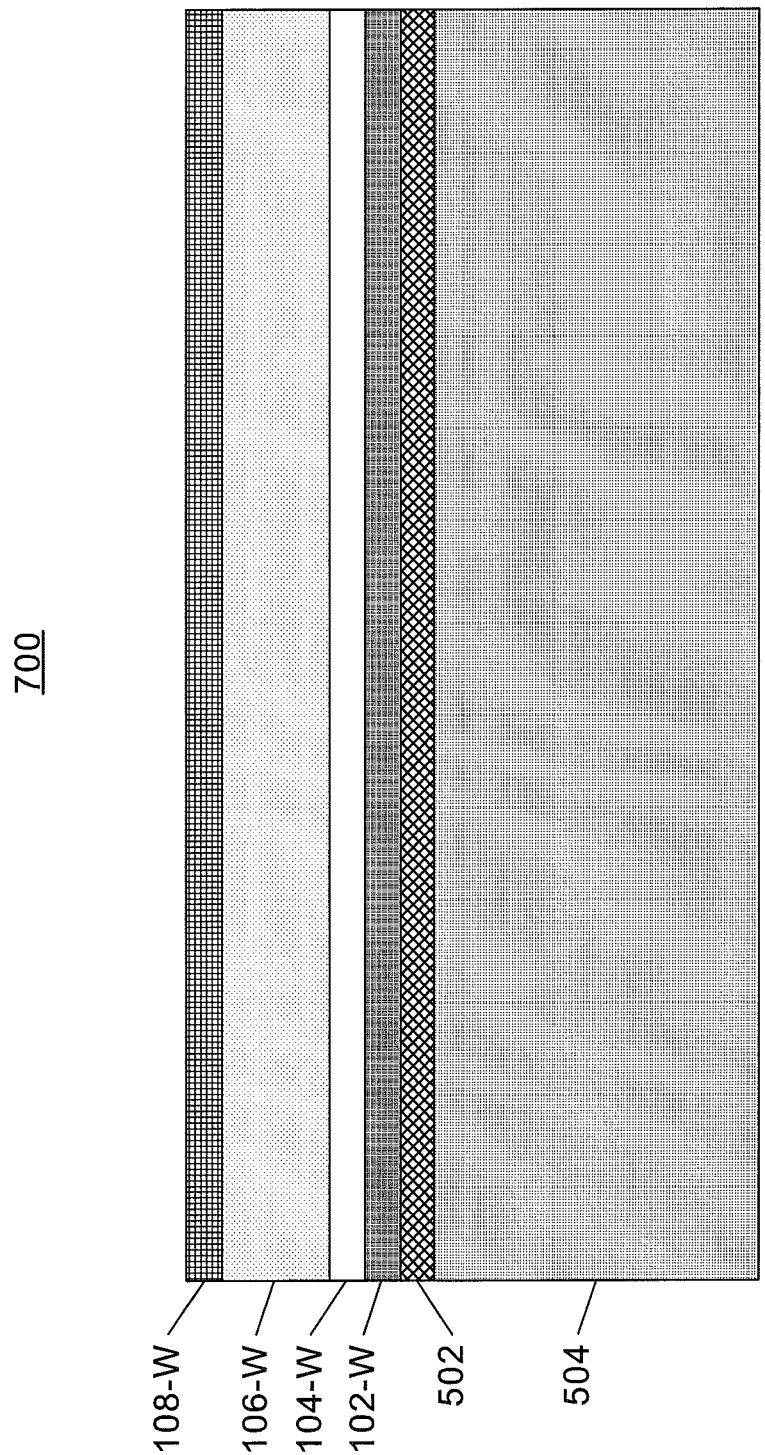
FIG. 7 schematically illustrates a cross-section of another in-process configuration of wafer layers processed according to the present disclosure.

FIG. 7 shows an layer configuration 700 at the completion of a next STEP 314. The selected substrate 106-W has a first surface and a second surface. The first surface of the selected substrate 106-W is the surface that is coupled to the second surface of the of the buffer layer 104-W, as recited above in reference to the STEP 310. At the STEP 314, a second circuit layer 108-W is formed, coupled to the second surface of the selected substrate 106-W. The second circuit layer 108-W comprises a plurality of second circuits of the ICs, each of which may be like the second circuit 108 of the IC 100 (as shown in the FIG. 1). In some embodiments, the second circuit layer 108-W comprises passive components (not shown). Passive components may be formed on the second surface of the selected substrate 106-W by depositing and patterning a plurality of layers, wherein the plurality of layers may comprise conductive materials such as metals or polysilicon, and insulating materials such as silicon dioxide. In some embodiments, the second circuit layer 108-W comprises active components (not shown) such as transistors. Active components may be formed by first depositing, coupling or bonding a semiconductor layer (not shown) to the second surface of the selected substrate 106-W, followed conventional semiconductor IC processing steps. Methods for forming passive and active components on a surface such as the second surface of the selected substrate 106-W are well known to those skilled in the IC design fabrication arts. In some embodiments, the second circuit layer 108-W may be fabricated on a third substrate (not shown), then transferred and coupled to the second surface of the selected substrate 106-W. Methods for transferring and bonding the second circuit layer 108-W to the second surface of the selected substrate 106-W will be known and understood to persons skilled in the arts of IC layer transfer technology, in light of the present teachings.

In some embodiments, the second circuit layer 108-W comprises acoustic wave components, such as acoustic wave RF filters. For example, if the selected substrate 106-W comprises a piezoelectric material such as quartz or a piezoelectric ceramic, the acoustic wave components may be formed directly on the selected substrate 106-W according to methods well known to those skilled in the arts of acoustic wave component manufacture. In another example, an added piezoelectric layer (not shown) may first be deposited, bonded or otherwise coupled to the selected substrate 106-W, followed by forming the acoustic wave components on the added piezoelectric layer. In yet other embodiments, the acoustic wave components may be formed on a third substrate (not shown), then transferred and bonded to the second surface of the selected substrate 106-W. In other embodiments, the second circuit layer 108-W may include opto-electronic devices and MEMS devices.

The second circuit layer 108-W may include, without limitation: RF circuits, digital circuits, filter circuits, resonator circuits, opto-electronic devices, acoustic wave devices, and MEMS devices.

Figure 8:
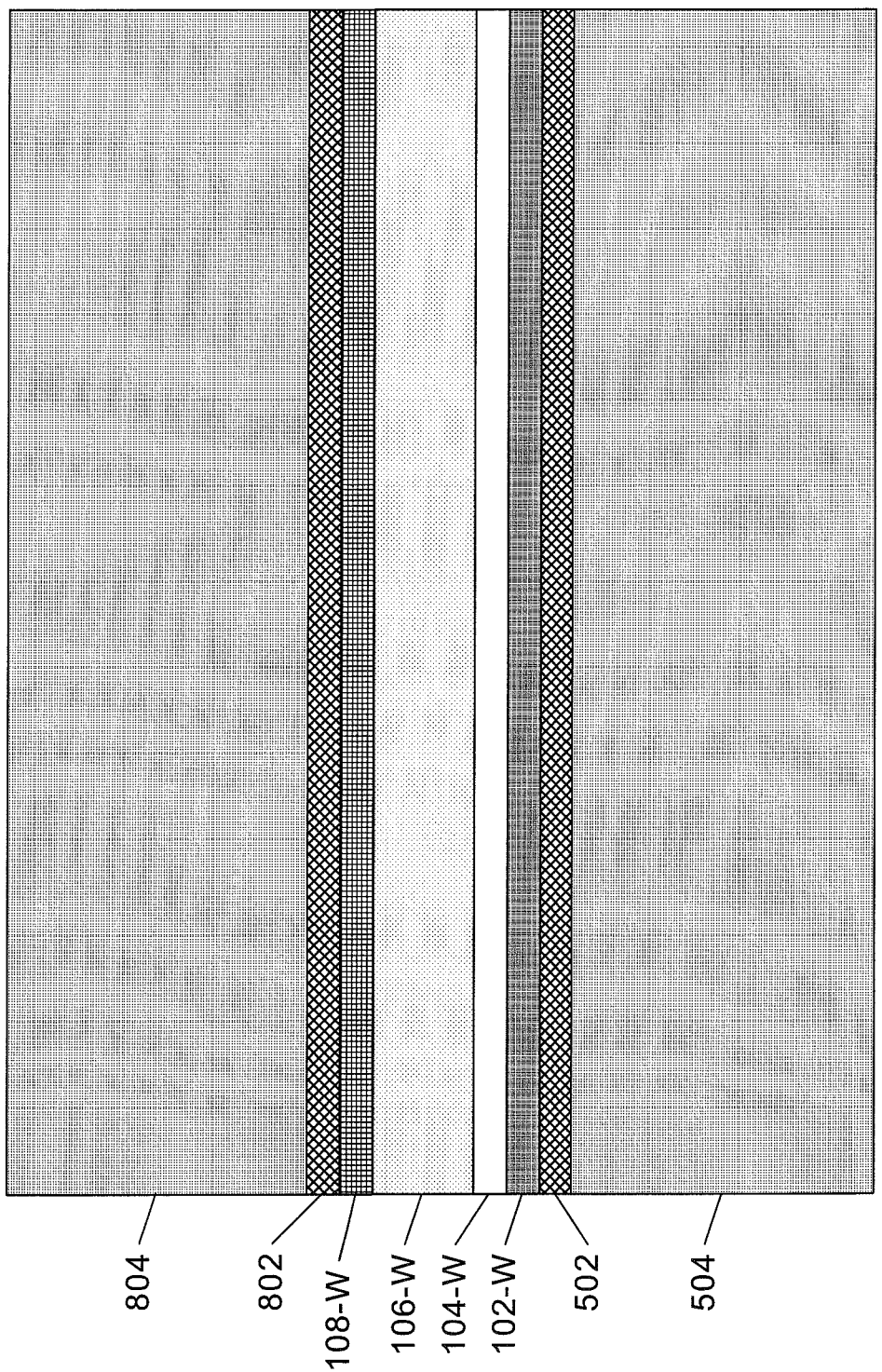
FIG. 8 schematically illustrates a cross-section of another in-process configuration of wafer layers processed according to the present disclosure.

FIG. 8 shows an layer configuration 800, including a second planarization layer 802 and a second handle wafer 804. The second planarization layer 802 is formed on the second circuit layer 108-W at a STEP 316.

The second handle wafer 804 is coupled to the second planarization layer at a STEP 318.

The first handle wafer 504 is removed at a STEP 320. In some embodiments, the first handle wafer 504 is coupled to the first planarization layer 502 by a light-releasable adhesive, allowing the first handle wafer 504 to be removed by exposure to light (e.g., by a UV laser), providing that the first handle wafer 504 is transparent to light. In accordance with the present teachings, any releasable adhesive method may be used, including light-releasable, thermally-releasable and solvent-releasable methods. In other embodiments, the first handle wafer 504 is coupled to the first planarization layer 502 by direct bonding or by an adhesive that cannot be released by exposure to UV light. In this example, the first handle wafer 504 may be removed by etching, polishing, or any convenient combination thereof. In other embodiments, the handle wafer may include holes to enable removal of an adhesive by solvents. Techniques for coupling and removing handle wafers are well known to those skilled in the arts of IC design fabrication, and any of these techniques may be practiced in accordance with the present methods and apparatus.

At a STEP 322, the first planarization layer 502 is removed. The first planarization layer 502 may be removed by an etching process such as liquid etching or reactive ion etching. Techniques for forming and removing planarization layers are well known to persons skilled in the arts of IC design fabrication, and any of these techniques may be practiced in accordance with the present teachings.

Figure 9:
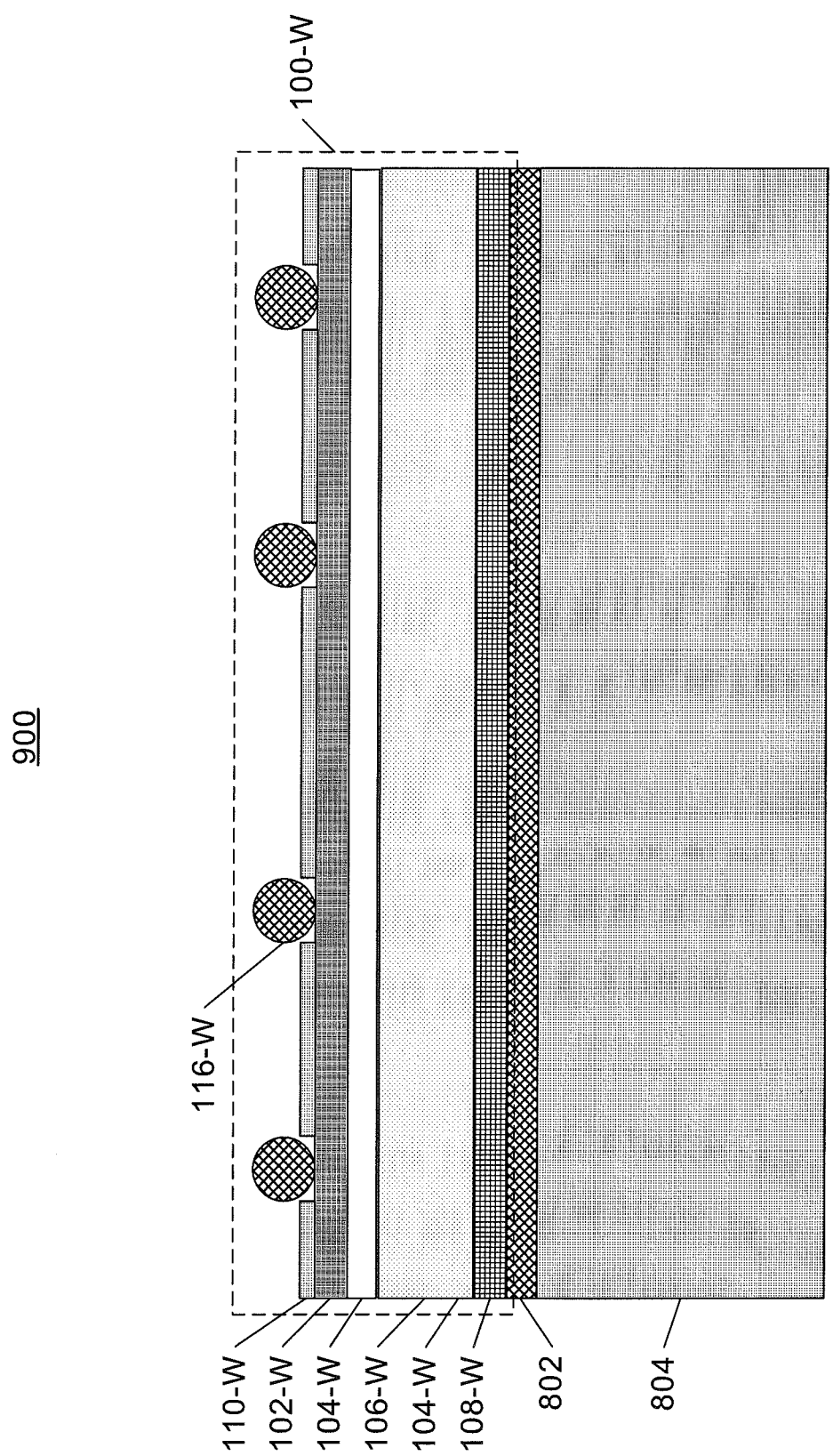
FIG. 9 schematically illustrates a cross-section of yet another in-process configuration of wafer layers processed according to the present disclosure.

A layer configuration 900 is illustrated in FIG. 9. Note that the layer configuration 900 is rotated by 180 degrees relative to the layer configuration 800. Contact elements 116-W (similar to the contact elements 116 of FIG. 1) are formed at a STEP 324. The STEP 324 may optionally include forming a cap layer 110-W (similar to the cap layer 110 of FIG. 1). The optional cap layer 110-W may comprise a passivation layer, and may comprise, without limitation: a silicon nitride layer, a silicon oxide layer, a phosphorus silicon glass layer, or any combination thereof. In some embodiments, the contact elements 116-W may include solder bumps. In other embodiments, conductive pillars (e.g., copper pillars) or other types of contact elements may be employed. Techniques for forming solder bumps, conductive pillars and similar contact elements are well known to those skilled in the IC design and fabrication arts, and any of these techniques may be practiced in accordance with the present methods and apparatus.

The second handle wafer 804 is removed at a next STEP 326, and the second planarization layer 802 is removed at a following STEP 328. Methods for removing handle layers and planarization layers are described hereinabove in reference to the STEPS 318 and 320.

The first method 300 is completed at a STEP 330, wherein the ICs of the processed wafer 100-W (shown in the FIG. 9) are separated into a plurality of dies (not shown), each die comprising an IC like the IC 100 of FIG. 1. The processed wafer 100-W may be separated into a plurality of dies by dicing, sawing or cleaving, according to methods that are well known to persons skilled in the IC design and manufacturing arts. The IC dies formed according the first method 300 may be operably coupled to package substrates to provide mounted ICs similar to the mounted IC 200 shown in FIG. 2.

In another embodiment, a method begins at an initial STEP (not shown) similar to the STEP 302 of the first method 300 (FIG. 3), except that the wafer 400 is replaced by a silicon wafer (not shown) comprising a single layer of silicon. According to the second method, instead of removing the silicon substrate 402 as described above with reference to the STEP 308 of the method 300, a similar thinning step comprises thinning the silicon wafer to a desired thickness. Also, according to the second method, instead of coupling the selected substrate 106-W to the buffer layer 104-W as described with reference to the STEP 310 of the method 300, a similar coupling step comprises coupling the selected substrate to the thinned silicon wafer. The coupling step of the second fabrication method may include forming a new buffer layer on the silicon wafer to facilitate bonding or coupling of the silicon to the selected substrate 106-W. Other steps of the second method correspond to like steps described above with reference to the first method 300 (FIG. 3).

In an embodiment of the inventive concept, a method (not shown) comprises the STEPS of: forming a first circuit layer on a silicon layer of a silicon-on-sapphire (SOS) wafer; forming a first planarization layer on the first circuit layer; coupling a first handle wafer to the first planarization layer; optionally thinning the sapphire layer to a desired thickness; forming a second circuit layer on the sapphire layer; removing the first handle wafer; removing the first planarization layer; forming a second planarization layer on the second circuit elements; coupling a second handle wafer to the second planarization layer; forming contact elements coupled to the first circuit layer; removing the second handle wafer; removing the second planarization layer; and separating the IC dies by dicing.

In other embodiments, the methods of fabrication may include STEPS that are performed in an order or sequence that differs from the order or sequence of the STEPS as described hereinabove in reference to the FIG. 3. For example, an embodiment of the inventive concept is a method 1000 as illustrated in a FIG. 10.

Figure 10:
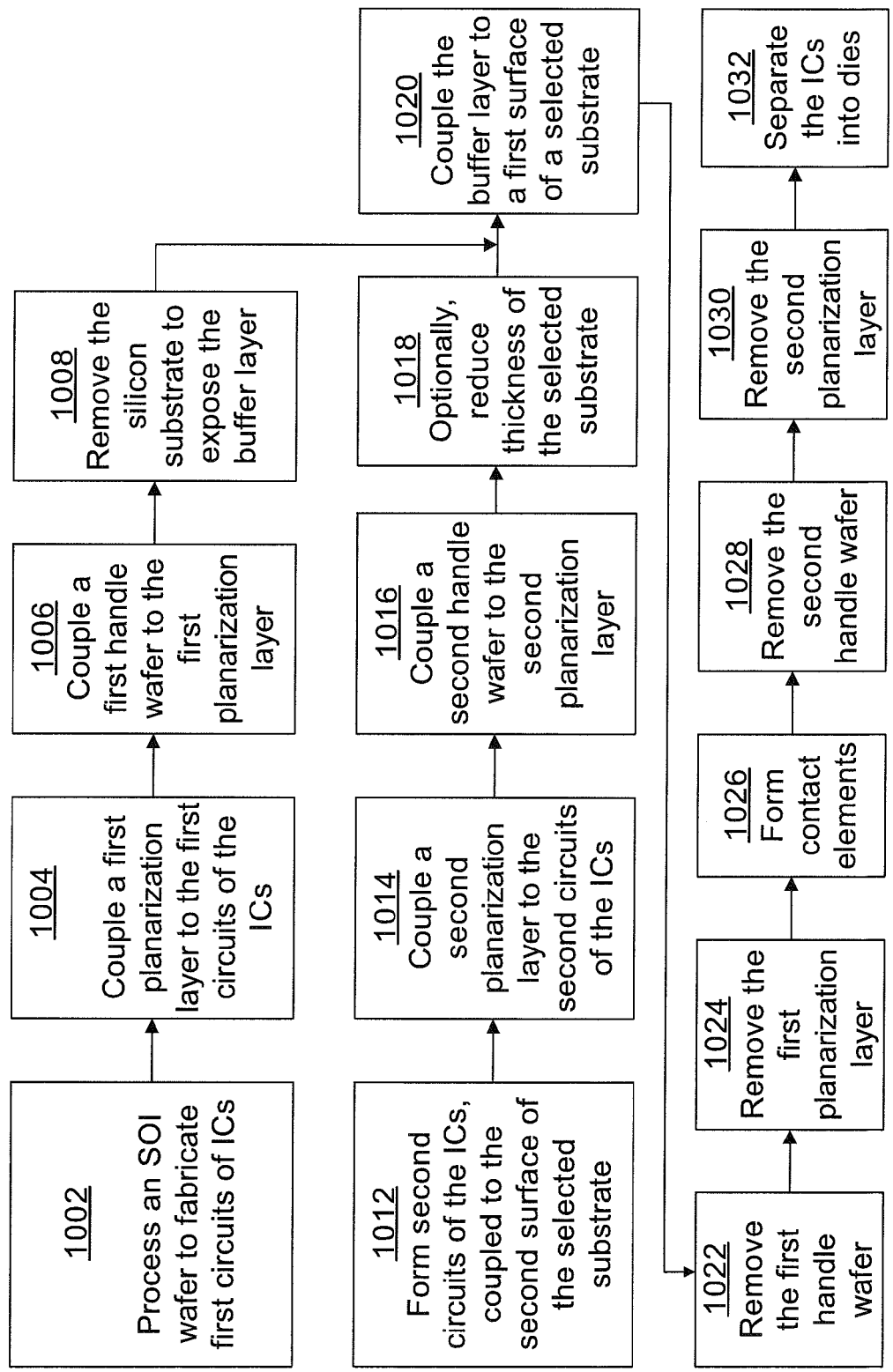
FIG. 10 is a flow-chart showing another disclosed method of forming ICs according to the present teachings.

Referring to both the FIG. 4 and the FIG. 10, the method 1000 begins at a STEP 1002 wherein the active layer 102-W is processed to form a plurality of first circuits of the ICs, similar to the first circuit 103 of the IC 100 shown in FIG. 1.

Proceeding to a STEP 1004, a planarization layer 502 (shown in FIG. 5) is formed on the active layer 102-W.

At a next STEP 1006, a first handle wafer 504 is coupled or bonded to the first planarization layer 502. FIG. 5 shows an layer configuration 500 at the completion of the STEP 306. In one example, the first planarization layer 502 may comprise polymer material applied by a spin-on method or other known method of manufacture. In another example, the first planarization layer 502 may comprise an oxide layer that is deposited and polished to provide a surface suitable for direct bonding, adhesive bonding, or other bonding methods. The first handle wafer 504 may comprise, without limitation: a silicon wafer, a sapphire wafer, a quartz wafer, or a glass wafer. The first handle layer 504 may be coupled or bonded to the first planarization layer 502 by means of an adhesive (e.g., a UV-release adhesive), by means of direct bonding, or by means of other bonding methods that are well known to persons skilled in the arts of IC fabrication.

Figure 11:
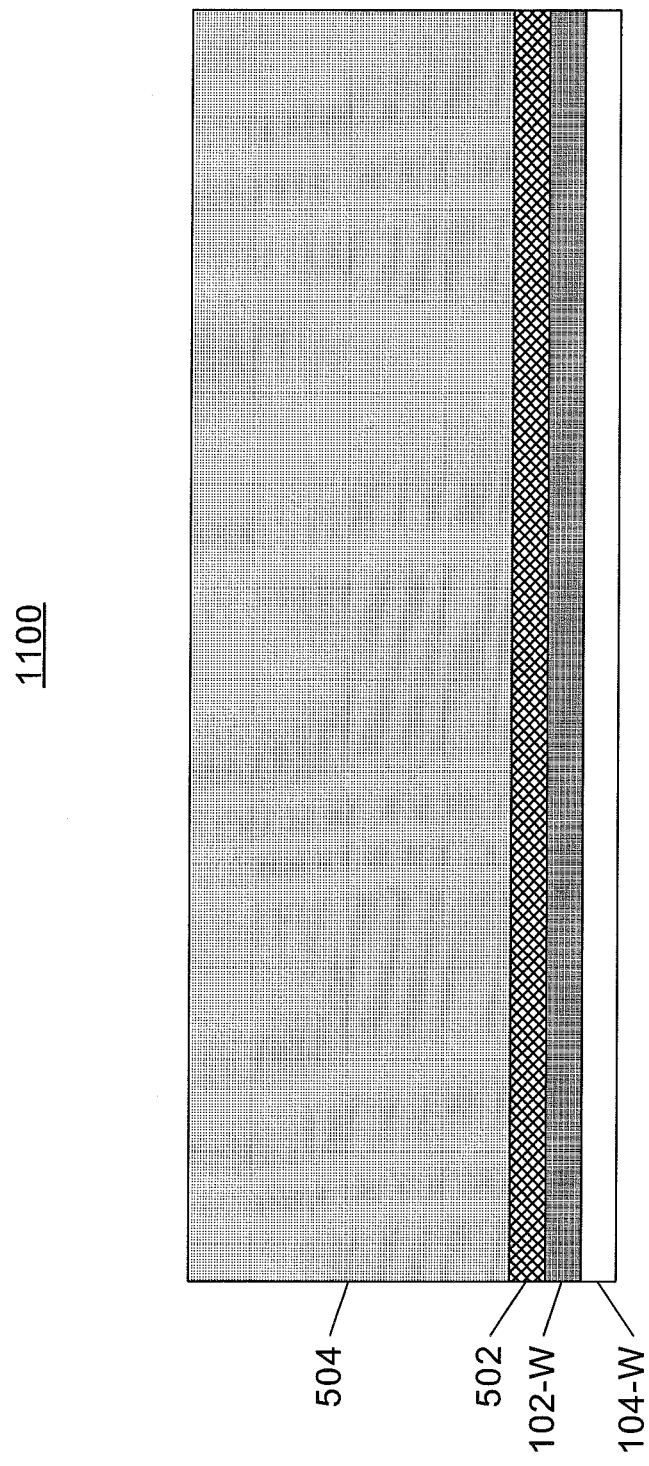
FIG. 11 schematically illustrates a cross-section of an in-process configuration of wafer layers processed according to the method of the FIG. 10.

At a next STEP 1008, the silicon substrate 402 (FIG. 4) is removed. The silicon material may be removed by etching, mechanical polishing, grinding, or any combination thereof. Methods for thinning or removing silicon layers are well known to persons skilled in the IC manufacturing arts. The buffer layer 104-W has a first surface and a second surface. The first surface of the buffer layer 104-W is the surface that is coupled to the active layer 102-W. At the completion of the STEP 1008, the second surface of the buffer layer 104-W is exposed, as illustrated by a layer configuration 1100 of a FIG. 11.

Figure 12:
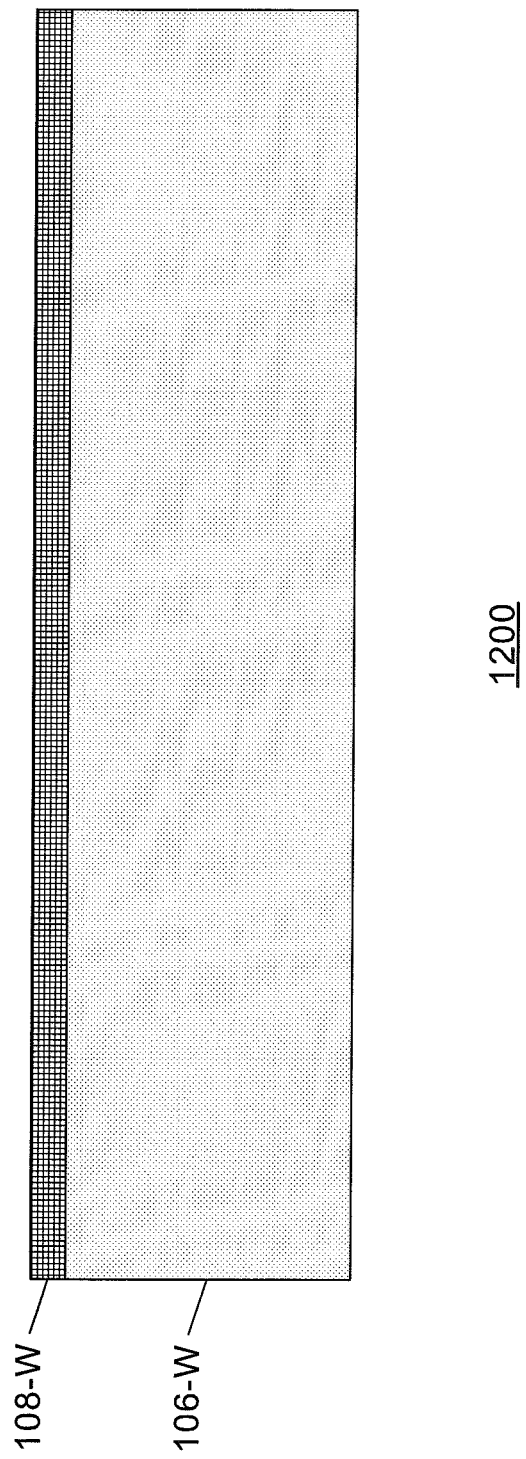
FIG. 12 schematically illustrates a cross-section of another in-process configuration of wafer layers processed according to the method of the FIG. 10.

The method 1000 includes a STEP 1012, which may be performed before, concurrently, or after the STEPS 1002 through 1008. Referring to a FIG. 12, the selected substrate 106-W has a first surface and a second surface. The first surface of the selected substrate 106-W is the surface to be coupled to the second surface of the of the buffer layer 104-W, as recited below in reference to a STEP 1020. At the STEP 1012, a second circuit layer 108-W is formed, coupled to the second surface of the selected substrate 106-W. The second circuit layer 108-W comprises a plurality of second circuits of the ICs, each of which may be like the second circuit 108 of the IC 100 (as shown in the FIG. 1). In some embodiments, the second circuit layer 108-W comprises passive components (not shown). Passive components may be formed on the second surface of the selected substrate 106-W by depositing and patterning a plurality of layers, wherein the plurality of layers may comprise conductive materials such as metals or polysilicon, and insulating materials such as silicon dioxide. In some embodiments, the second circuit layer 108-W comprises active components (not shown) such as transistors. Active components may be formed by first depositing, coupling or bonding a semiconductor layer (not shown) to the second surface of the selected substrate 106-W, followed conventional semiconductor IC processing steps. Methods for forming passive and active components on a surface such as the second surface of the selected substrate 106-W are well known to those skilled in the IC design fabrication arts. In some embodiments, the second circuit layer 108-W may be fabricated on a third substrate (not shown), then transferred and coupled to the second surface of the selected substrate 106-W. Methods for transferring and bonding the second circuit layer 108-W to the second surface of the selected substrate 106-W will be known and understood to persons skilled in the arts of IC layer transfer technology, in light of the present teachings.

In some embodiments, the second circuit layer 108-W comprises acoustic wave components, such as acoustic wave RF filters. For example, if the selected substrate 106-W comprises a piezoelectric material such as quartz or a piezoelectric ceramic, the acoustic wave components may be formed directly on the selected substrate 106-W according to methods well known to those skilled in the arts of acoustic wave component manufacture. In another example, an added piezoelectric layer (not shown) may first be deposited, bonded or otherwise coupled to the selected substrate 106-W, followed by forming the acoustic wave components on the added piezoelectric layer. In yet other embodiments, the acoustic wave components may be formed on a third substrate (not shown), then transferred and bonded to the second surface of the selected substrate 106-W. The second circuit layer 108-W may include, without limitation: RF circuits, digital circuits, filter circuits, resonator circuits, opto-electronic devices, acoustic wave devices, and MEMS devices.

Figure 13:
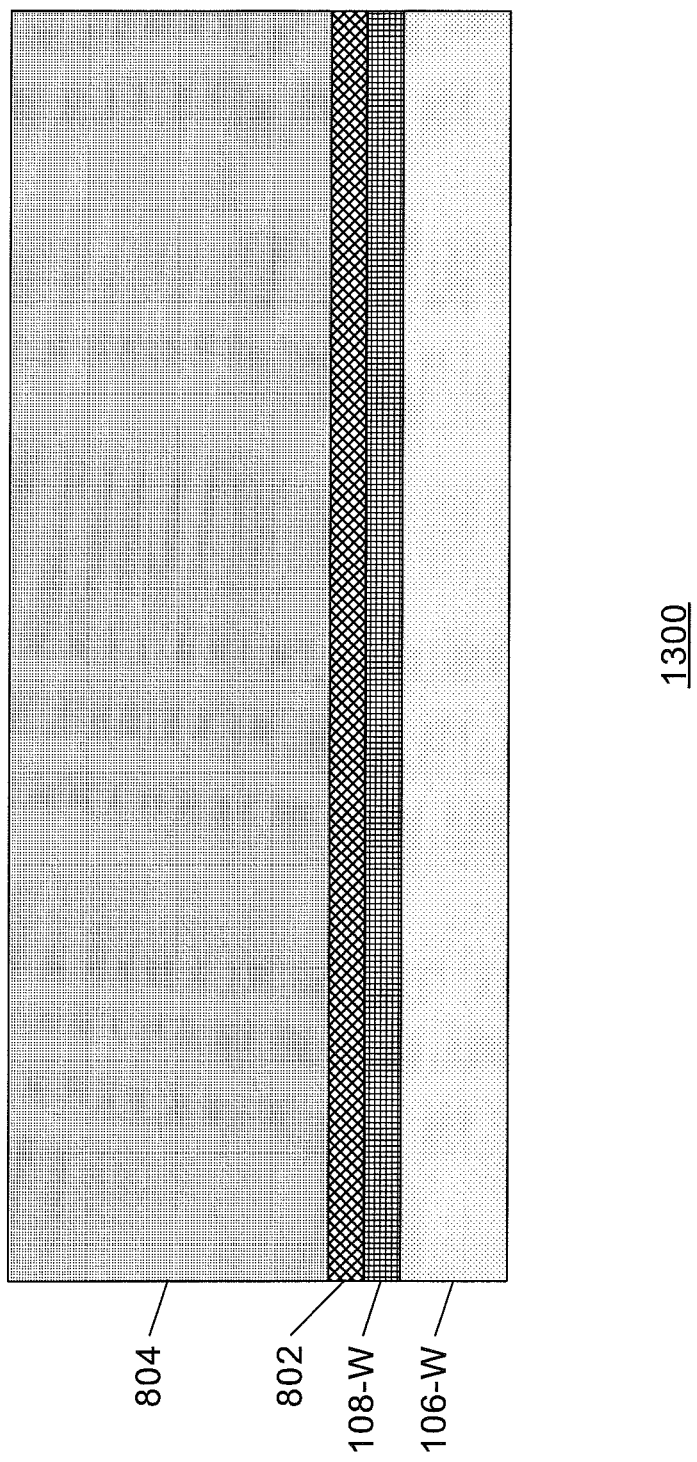
FIG. 13 schematically illustrates a cross-section of yet another in-process configuration of wafer layers processed according to the method of the FIG. 10.

FIG. 13 shows an layer configuration 1300, including a second planarization layer 802 and a second handle wafer 804. The second planarization layer 802 is formed on the second circuit layer 108-W at a STEP 1014. The second handle wafer 804 is coupled to the second planarization layer at a STEP 1016.

At a STEP 1018, the thickness of the selected substrate 106-W is reduced to a selected thickness. The thickness of the selected substrate 106-W may be reduced by etching, mechanical polishing, grinding, or a by combination thereof. In one example, the selected thickness may be selected from the range of 10 to 1000 micrometers. In some embodiments, the STEP 1018 may be optionally omitted.

A STEP 1020 is performed subsequently to both the STEPS 1008 and 1018. At the STEP 1020, the second surface of the buffer layer 104-W (the bottom surface of the buffer layer 104-W, shown in the FIG. 11) is coupled to the first surface of the selected substrate 106-W (i.e., the bottom surface of the selected substrate 106-W, shown in the FIG. 13). At the completion of the STEP 1020, the layer configuration is like the layer configuration 800 shown in the FIG. 8. The STEP 1020 may be effected by means of an adhesive, by means of direct bonding, or by other methods that are well known to persons skilled in the arts of IC fabrication, as described hereinabove in reference to the STEP 310 of the method 300 (shown in the FIG. 3). The selected substrate 106-W may comprise, without limitation, one of the following types: sapphire, quartz, silicon dioxide glass, aluminum nitride, hot-pressed silicon carbide ceramic, sintered silicon carbide ceramic, CVD silicon carbide, and alumina. In some embodiments, the selected substrate 106-W may comprise a piezoelectric material whereon acoustic wave devices may be formed.

Referring to the FIG. 8, the first handle wafer 504 is removed at a STEP 1022 of the method 1000, as described hereinabove in reference to the STEP 320 of the method 300.

At a STEP 1024, the first planarization layer 502 is removed, as described hereinabove in reference to the STEP 322 of the method 300.

An layer configuration 900 is illustrated in FIG. 9. Note that the layer configuration 900 is rotated by 180 degrees relative to the layer configuration 800. Contact elements 116-W (similar to the contact elements 116 of the FIG. 1) are formed at a STEP 1026, as described hereinabove in reference to the STEP 324 of the method 300. The STEP 1026 may optionally include forming a cap layer 110-W (similar to the cap layer 110 of FIG. 1).

The second handle wafer 804 is removed at a STEP 1028, and the second planarization layer 802 is removed at a following STEP 1030, as described hereinabove in reference to the STEPS 318 and 320 of the method 300.

The method 1000 is completed at a STEP 1032, wherein the processed wafer 100-W (shown in FIG. 9) is separated into a plurality of dies (not shown), each die comprising an IC like the IC 100 of FIG. 1. The processed wafer 100-W may be separated into a plurality of dies by dicing, sawing or cleaving, according to methods that are well known to persons skilled in the IC design and manufacturing arts. In one embodiment, the IC dies formed according the first method 300 may be operably coupled to package substrates to provide mounted ICs similar to the mounted IC 200 shown in FIG. 2. In other embodiments, embedded die packaging mounting methods may be employed.

Figure 14:
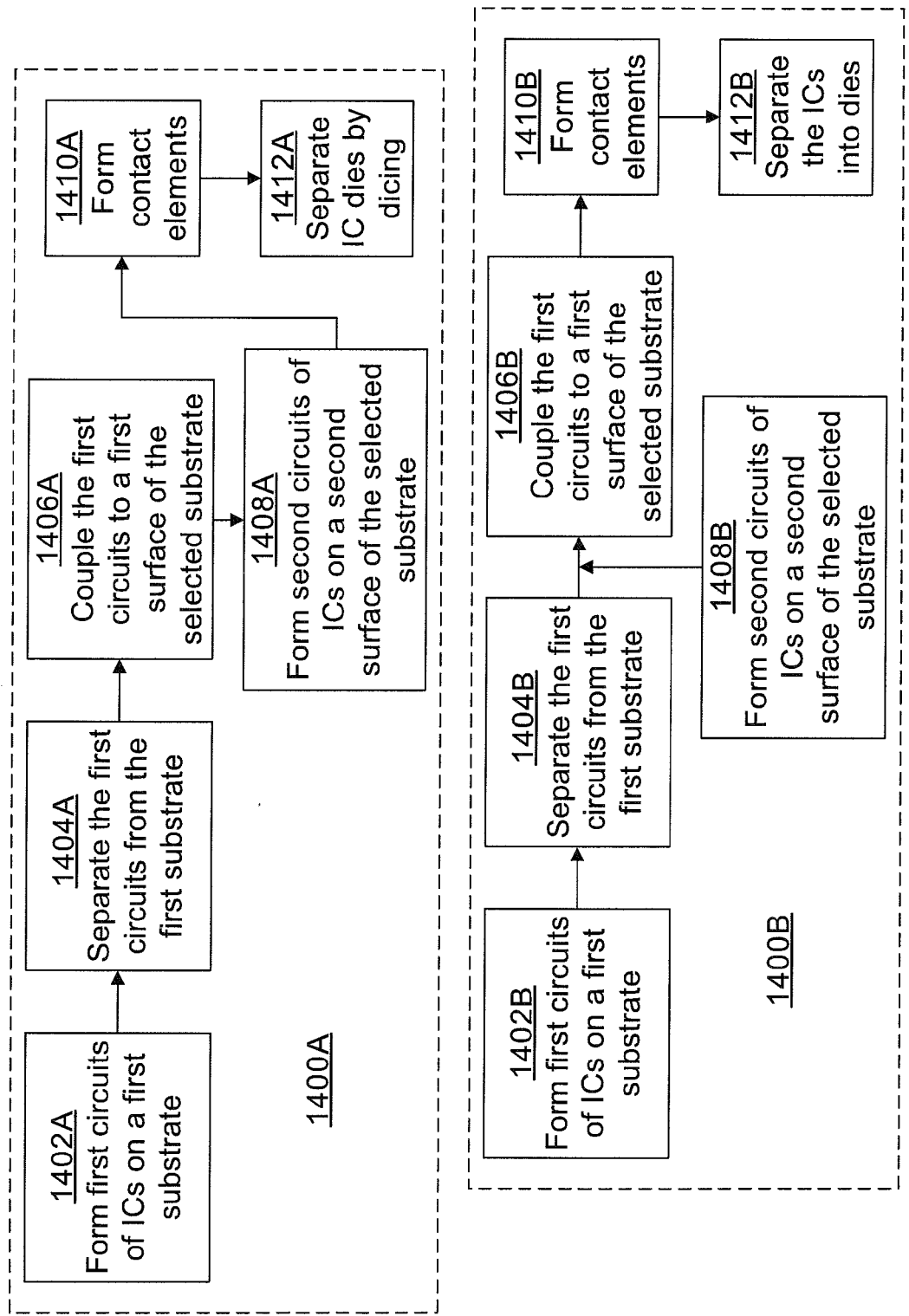
FIG. 14 includes two flow-charts, showing further disclosed methods of forming ICs according to the present teachings.
Figure 15:
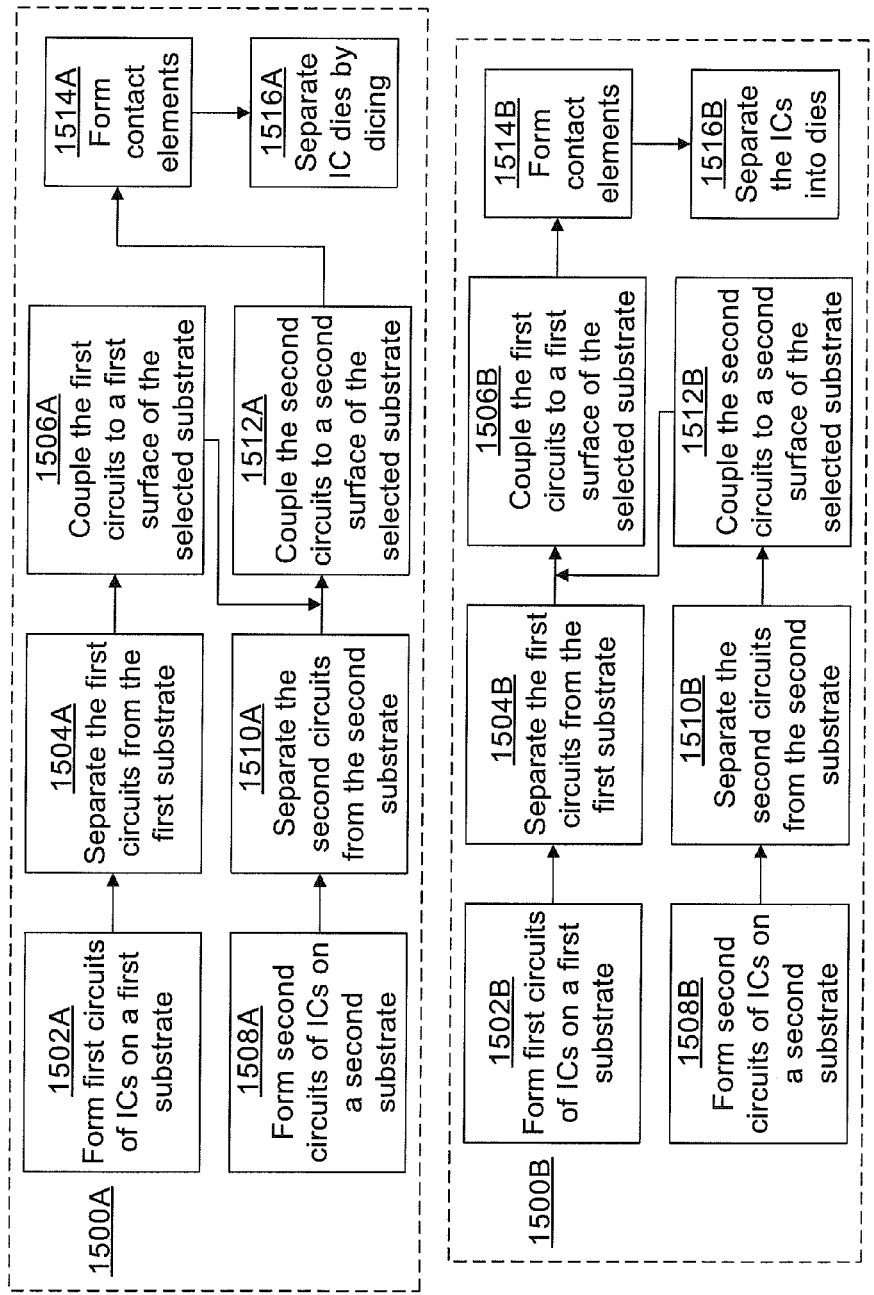
FIG. 15 includes two additional flow-charts, showing further disclosed methods of forming ICs according to the present teachings.

Aspects of the present inventive methods may be illustrated by simplified flow diagrams as shown in FIGS. 14 and 15. In these simplified flow diagrams, some STEPS are not shown, for the purpose of highlighting selected aspects of the inventive concept. The STEPS not shown are combined into, or included in, other STEPS, as described hereinbelow in reference to the FIGS. 14 and 15.

Referring to the FIG. 14, a method 1400A is illustrated. The method 1400A includes STEPS similar to the STEPS of the method 300, described hereinabove in reference to the FIG. 3.

In the method 1400A, a STEP 1402A comprises forming the first circuit layer of the ICs on a first substrate. The STEP 1402A may include processing methods like or equivalent to the processing methods of the STEP 302 of the method 300.

At a STEP 1404A, the first circuit layer is separated from the first substrate. The STEP 1404A may comprise a combination of the STEPS 304, 306 and 308 of the method 300, or other processing methods known to persons skilled in the arts of IC layer transfer technology.

At a next STEP 1406A, the first circuit layer is coupled to the first surface of the selected substrate. The STEP 1406A may include processing methods like the processing methods of the STEP 310 of the method 300, or other processing methods.

At a next STEP 1408A, a second circuit layer of the ICs are formed on a second surface of the selected substrate. The STEP 1408A may comprise a combination of the STEPS 312 to 322 of the method 300, or other processing methods.

A STEP 1410A comprises forming contact elements of the ICs. The STEP 1410A may include processing methods like the processing methods of the STEP 324, or other processing methods.

The method 1400A is completed at a STEP 1412A, wherein the ICs are separated into dies by dicing. The STEP 1412A may comprise a combination of the STEPS 326, 328 and 330 of the method 300, or other processing methods.

Persons skilled in the arts of IC layer transfer technology will know and understand any other processing methods or STEPS, not shown or described in detail herein, that may be required to implement the method 1400A, in light of the present teachings.

FIG. 14 also shows a flow diagram of a method 1400B. Each STEP of the method 1400B is like and equivalent to a corresponding STEP of the method 1400A, wherein the numerical designation of the corresponding STEP is the same, but the alphabetical designation is "B" rather than "A". The method 1400B differs from the method 1400A in the following two particulars: (1) The method 1400B proceeds from the STEPS 1404B and 1408B to the STEP 1406B, whereas the method 1400A proceeds from the STEP 1406A to the STEP 1408A; and (2) the method 1400B proceeds from the STEP 1406B to the STEP 1410B, whereas the method 1400A proceeds from the STEP 1408A to the STEP 1410A.

The method 1400A includes STEPS similar to the STEPS of the method 1000, described hereinabove in reference to the FIG. 10.

Persons skilled in the arts of IC layer transfer technology will know and understand any other processing methods or STEPS, not shown or described in detail herein, that may be required to implement the method 1400B, in light of the present teachings.

Referring to the FIG. 15, methods 1500A and 1500B are embodiments wherein the second circuit layer is initially formed on a second substrate, then transferred and coupled to the selected substrate by means of layer transfer methods.

In the method 1500A, a STEP 1502A comprises forming the first circuit layer of the ICs on the first substrate. The STEP 1502A may include processing methods like or equivalent to the processing methods of the STEP 302 of the method 300.

At a STEP 1504A, the first circuit layer is separated from the first substrate. The STEP 1504A may comprise a combination of the STEPS 304, 306 and 308 of the method 300, or other processing methods A STEP 1506A may comprise a combination of the STEP 310 and the optional thinning STEP 312, or other processing methods. Referring to the layer configuration 600 of the FIG. 6, at the completion of the STEP 1506A, the first surface of the selected substrate 106-W is coupled to the buffer layer 104-W, and the second surface of the selected substrate 106-W is accessible for further processing.

Figure 16:
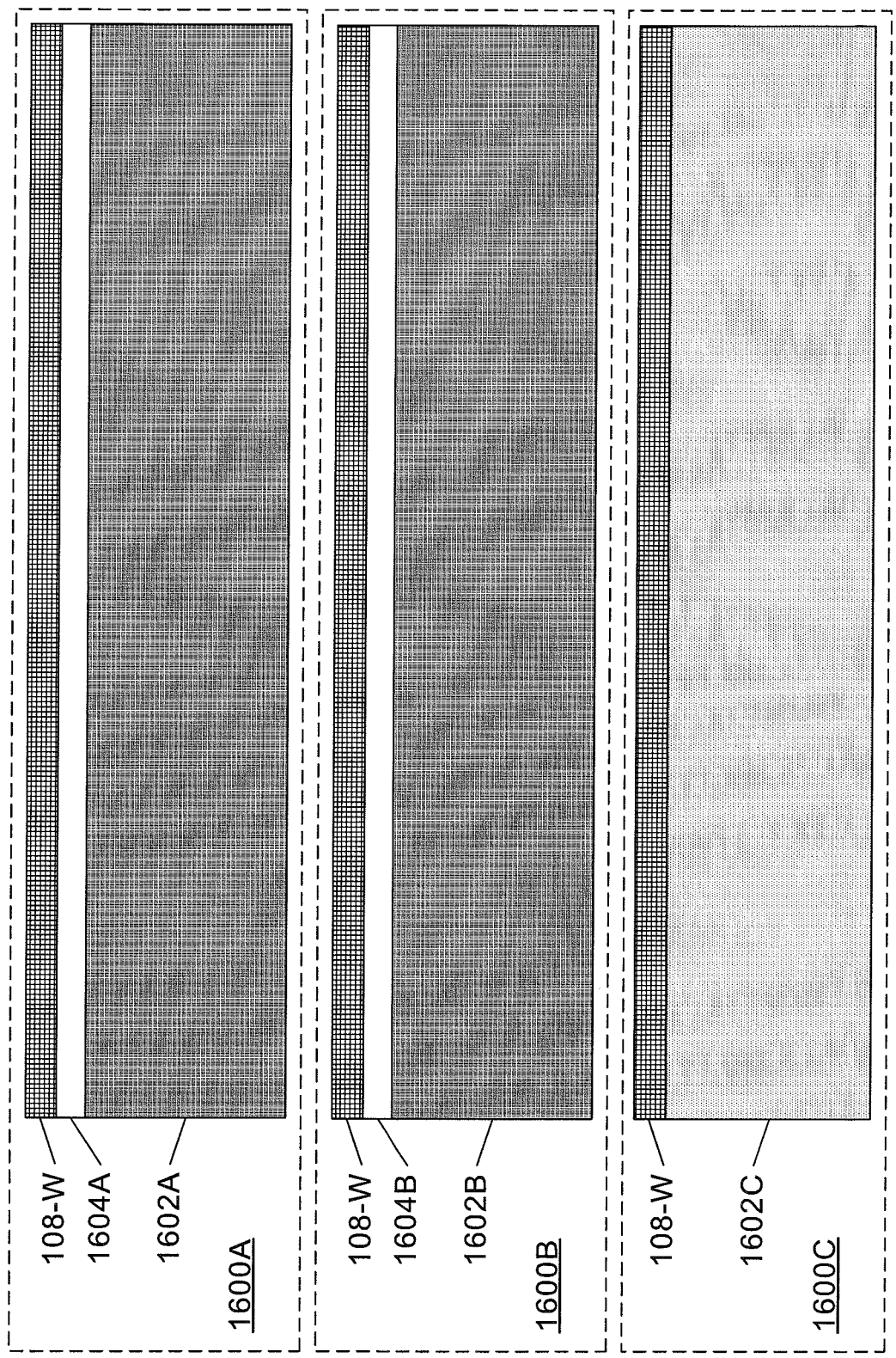
FIG. 16 schematically illustrates cross-sections of in-process configuration of wafer layers processed according to the methods of the FIGS. 14 and 15.

A FIG. 16 shows layer configurations 1600A, 1600B and 1600C that may be obtained subsequent to a STEP 1508A, described hereinbelow. Not shown in the FIG. 16 are planarization layers that may be coupled to the second circuit layers 108-W, and handle wafers that may be coupled to the planarization layers.

At the STEP 1508A, the second circuit layer is formed on the second substrate. The second substrate may comprise, without limitation: an SOI substrate; a substrate comprising a silicon substrate coupled to an insulating top layer (e.g., silicon dioxide); or a piezoelectric substrate whereon acoustic wave components may be fabricated.

In a first embodiment of the method 1500A, the second substrate may comprise an SOI substrate similar to the SOI substrate 400 of the FIG. 4. In this embodiment, at the STEP 1508A, the second circuit layer 108-W (refer to layer configuration 1600A of the FIG. 16) is formed on the SOI substrate according to processing methods like and equivalent to the processes described hereinabove in reference to the STEP 302 of the method 300 (FIG. 3). In this first embodiment, by performing the STEP 1508A, the wafer configuration 1600A is obtained. The wafer configuration 1600A comprises a silicon substrate 1602A, a buffer layer (e.g., a BOX layer) 1604A, and the second circuit layer 108-W. In the wafer configuration 1600A, the second circuit layer 108-W is coupled to a first surface of the buffer layer 1604A.

In a second embodiment of the method 1500A, the second substrate may comprise a silicon substrate 1602B coupled to an insulating top layer 1604B, as shown in the layer configuration 1600B of the FIG. 16. In this second embodiment, at the STEP 1508A, the second circuit layer 108-W is formed on the exposed surface of the insulating top layer 1604B according processing methods like or equivalent to those described hereinabove in reference to the STEP 314 of the method 300 (FIG. 3). The layer configuration 1600B is obtained by performing the STEP 1508A according to this second embodiment. The wafer configuration 1600B comprises the silicon substrate 1602B, the insulating top layer 1604B, and the second circuit layer 108-W. In the wafer configuration 1600B, the second circuit layer 108-W is coupled to a first surface of the insulating top layer 1604B.

Refer to the layer configuration 1600C of the FIG. 16. In a third embodiment of the method 1500A, the second substrate may comprise the piezoelectric substrate 1602C. In this third embodiment, at the STEP 1508A, the second circuit layer 108-W is formed on the piezoelectric substrate 1602C according to processes well known to persons skilled in the arts of fabricating acoustic wave components. The layer configuration 1600C comprises a piezoelectric substrate 1602C, and the second circuit layer 108-W. In the wafer configuration 1600C, the second circuit layer 108-W is coupled to a first surface of the piezoelectric substrate 1602C.

At a STEP 1510A, the second circuit layer 108-W is separated from the second substrate. For the layer configurations 1600A and 1600B (i.e., the first and second embodiments of the method 1500A), the STEP 1510A may include processing methods like or equivalent to the processing methods of the STEP 1504A, described hereinabove. For the layer configuration 1600C (i.e., the third embodiment of the method 1500A), the STEP 1510A may comprise thinning the piezoelectric substrate 1602C to a selected thickness. The thinning process may be performed according to processes and design criteria that will be readily apparent to persons skilled in the arts of layer transfer technology.

For the first embodiment of the method 1500A, at the completion of the STEP 1510A, a second surface of the buffer layer 1604A will be exposed for coupling to the selected substrate according to a subsequent STEP 1512A.

For the second embodiment of the method 1500A, at the completion of the STEP 1510A, a second surface of the insulating top layer 1604B will be exposed for coupling to the selected substrate according to the subsequent STEP 1512A.

For the third embodiment of the method 1500A, at the completion of the STEP 1510A, a second surface of the piezoelectric substrate 1602C will be exposed for coupling to the selected substrate according to the subsequent STEP 1512A.

At the STEP 1512A, the second circuit layer is coupled to the second surface of the selected substrate. As recited hereinabove, "referring to the layer configuration 600 of the FIG. 6, at the completion of the STEP 1506A, the first surface of the selected substrate 106-W is coupled to the buffer layer 104-W, and the second surface of the selected substrate 106-W is accessible for further processing."

According to the first embodiment of the method 1500A, at the STEP 1512A, the second surface of the buffer layer 1604A is coupled to the second surface of the selected substrate 106-W.

According to the second embodiment of the method 1500A, at the STEP 1512A, the second surface of the insulating top layer 1604B is coupled to the second surface of the selected substrate 106-W.

According to the third embodiment of the method 1500A, at the STEP 1512A, the second surface of the piezoelectric substrate 1602C is coupled to the second surface of the selected substrate 106-W.

At a STEP 1514A, referring to the FIG. 9, contact elements 116-W are formed on the ICs, according to processing methods like or equivalent to the processing methods described in reference to the STEP 324 of the method 300.

The method 1500A is completed at a STEP 1516A, wherein IC are separated into dies according to processing methods like or equivalent to the processes described in reference to the STEP 330 of the method 300.

FIG. 15 also shows a flow diagram of a method 1500B. Each STEP of the method 1500B is like and equivalent to a corresponding STEP of the method 1500A, wherein the numerical designation of the corresponding STEP is the same, but the alphabetical designation is "B" rather than "A". The method 1500B differs from the method 1500A in the following two particulars: (1) The method 1500B proceeds from the STEPS 1504B and 1512B to the STEP 1506B, whereas the method 1500A proceeds from the STEP 1506A to the STEP 1512A; and (2) the method 1500B proceeds from the STEP 1506B to the STEP 1514B, whereas the method 1500A proceeds from the STEP 1512A to the STEP 1514A. Persons skilled in the arts of IC layer transfer technology will know and understand any other process modifications, not shown or described in detail herein, that may be required to implement the method 1500B, in light of the present teachings.

Exemplary Types of ICs

Integrated circuits in accordance with the present teachings include, without limitation, RF amplifier ICs and RF switch ICs.

Figure 17:
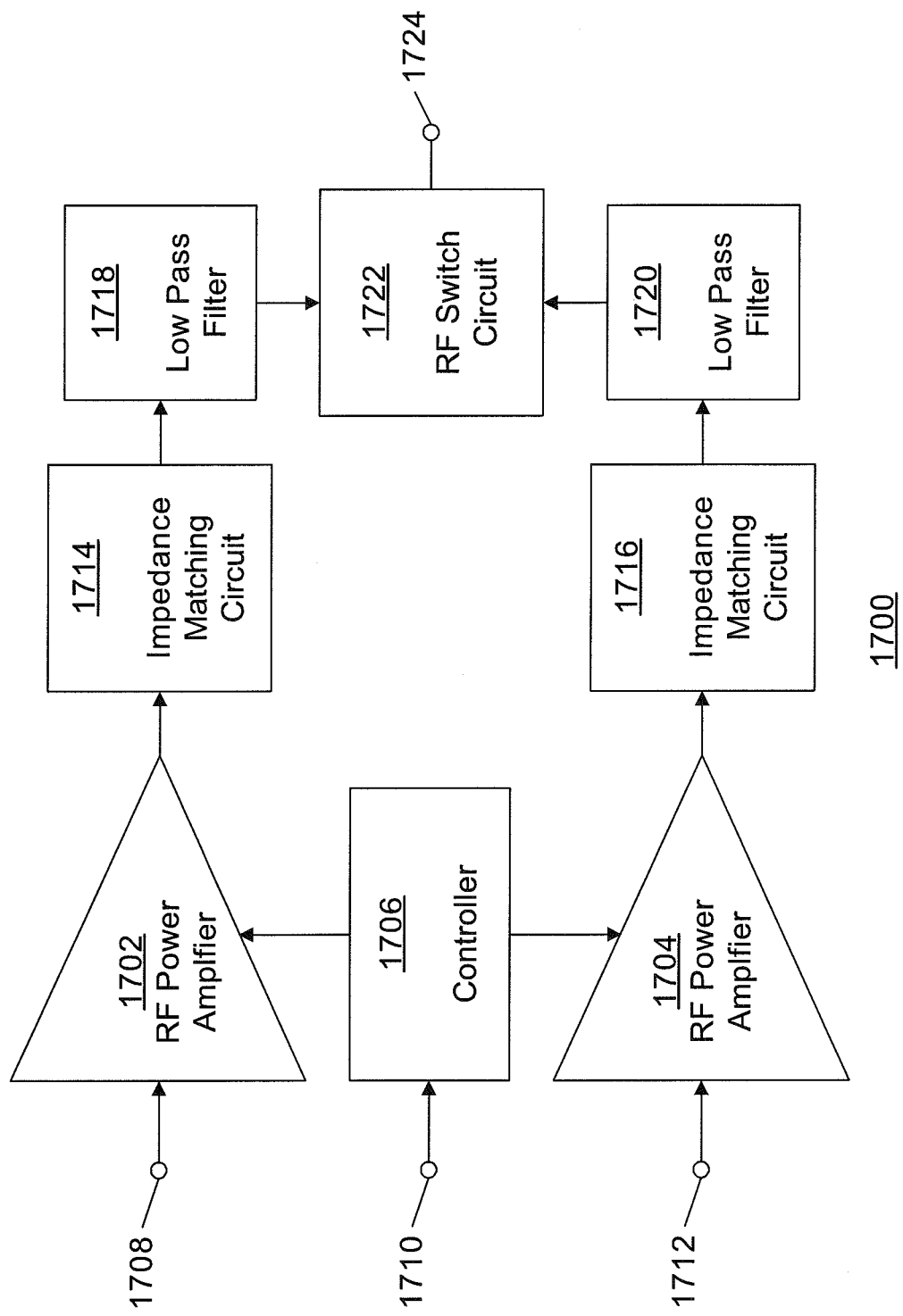
FIG. 17 is a block diagram of an exemplary RF integrated circuit that may be implemented according the present teachings.

An example of an RF IC that may be advantageously embodied in accordance with the present teachings is an IC 1700 illustrated by the block diagram of a FIG. 17. In accordance with this example, the IC 1700 may be an RF IC used in a mobile communication device such as a cell phone. An exemplary function for an RF IC like the IC 1700 would be to provide a selected, conditioned, and amplified RF signal for transmission to an antenna of the mobile device.

The IC 1700 includes RF power amplifiers (RF PAs) 1702 and 1704. The RF PA 1702 is operably coupled to receive an RF input signal from the input 1708, and the RF PA 1704 to receive an RF input signal from the input 1712. A controller circuit 1706 is operably coupled to receive inputs signals and voltages from an input 1710, which may comprise a plurality of inputs (not shown). The controller circuit is operably coupled to provide signals to the RF PAs 1702 and 1704, responsive to signals received via the input 1710, thereby adapting the amplification gain and/or other properties of the RF PAs 1702 and 1704.

The RF PA 1702 is operably coupled to provide amplified RF signals to an impedance matching circuit 1714, and the RF PA 1704 to provide amplified RF signals to an impedance matching circuit 1716. The impedance matching circuits 1714 and 1716 process or condition the amplified RF signals, and provide the amplified and conditioned RF signals to RF filters 1718 and 1720, respectively, for further processing or conditioning. In one embodiment, the RF filters 1718 and 1720 may be low pass RF filters.

An RF switch 1722 is operably coupled to receive a first RF signal from the RF filter 1718, and a second RF signal from the RF filter 1720. A single RF signal output is selected from the first RF signal and the second RF signal, and conveyed by the RF switch 1722 to an output 1724. The output 1724 may be operably coupled to an antenna, not shown, to provide a RF transmission signal. The single RF signal output may be selected according to a control signal received from an control input line, not shown.

According to prior art teachings, the impedance matching circuits 1714 and 1716, and the RF filters 1718 and 1720, cannot be effectively included on the same chip as the active circuit components 1702, 1704, 1706 and 1722, for reasons as described in paragraph 003 hereinabove, and elsewhere in the present disclosure. Because they include active devices, the components 1702, 1704, 1706 and 1722 may be advantageously included as components of the first circuit 103 (refer to the FIG. 1) of the RF IC 100, according the present teachings. The components 1718 and 1720 comprise passive components. Therefore, the components 1718 and 1720 may effectively implemented on a sapphire substrate, for example, using standard techniques for fabricating passive components on an insulating surface. Consequently, the components 1718 and 1720 may be advantageously included as components of the second circuit 108. Persons skilled in the arts of IC design and fabrication will readily understand from the present example how other ICs may be advantageously implemented in accordance with the present teachings.

A number of embodiments of the present inventive concept have been described. Nevertheless, it will be understood that various modifications may be made without departing from the scope of the inventive teachings. Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A method for forming integrated circuits (ICs) from a semiconductor wafer including an active layer, a buffer layer for improved electrical isolation between electronic components, and a silicon substrate, a first surface of the buffer layer coupled to the active layer, and a second, opposite surface of the buffer layer coupled to the silicon substrate, comprising:
    a) forming a first circuit layer of active and/or passive electronic components in the active layer of the semiconductor wafer;
    b) removing the silicon substrate from the semiconductor wafer to expose the second surface of the buffer layer;
    c) coupling the second surface of the buffer layer to a first surface of a monolithic insulating substrate suitable for forming active and/or passive electronic components; and,
    d) forming a second circuit layer of active and/or passive electronic components on a second, opposite surface of the insulating substrate.

2. The method of claim 1, wherein the insulating substrate comprises a material selected from the following types of materials: sapphire, quartz, silicon dioxide glass, aluminum nitride, hot-pressed silicon carbide, sintered silicon carbide, CVD silicon carbide, and alumina.

3. The method of claim 1, wherein the insulating substrate comprises sapphire, and wherein the second circuit layer comprises only passive electronic components.

4. The method of claim 1, wherein the insulating substrate comprises a piezoelectric material, and wherein the second circuit layer comprises acoustic wave electronic components.

5. The method of claim 1, further comprising thinning the insulating substrate subsequent to coupling the second surface of the buffer layer to the first surface of the insulating substrate and prior to forming the second circuit layer on the second surface of the insulating substrate.

6. The method of claim 1, further comprising:
    a) forming contact elements on the first circuit layer; and,
    b) separating the ICs into dies, each die comprising an IC.

7. A method for forming integrated circuits (ICs) from a semiconductor wafer including an active layer, a buffer layer for improved electrical isolation between electronic components, and a silicon substrate, a first surface of the buffer layer coupled to the active layer, and a second, opposite surface of the buffer layer coupled to the silicon substrate, comprising:
    a) forming a first circuit layer of active and/or passive electronic components in the active layer of the semiconductor wafer;
    b) removing the silicon substrate from the semiconductor wafer to expose the second surface of the buffer layer;
    c) forming a second circuit layer of active and/or passive electronic components on a second surface of a monolithic insulating substrate suitable for forming active and/or passive electronic components; and,
    d) after forming the second circuit layer, coupling the second surface of the buffer layer to a first, opposite surface of the insulating substrate.

8. The method of claim 7, wherein the insulating substrate comprises a material selected from the following types of materials: sapphire, quartz, silicon dioxide glass, aluminum nitride, hot-pressed silicon carbide ceramic, sintered silicon carbide ceramic, CVD silicon carbide, and alumina.

9. The method of claim 7, wherein the insulating substrate comprises sapphire, and wherein the second circuit layer comprises only passive electronic components.

10. The method of claim 7, wherein the insulating substrate comprises a piezoelectric material, and wherein the second circuit layer comprises acoustic wave electronic components.

11. The method of claim 7, further comprising thinning the insulating substrate subsequent to forming the second circuit layer on the second surface of the insulating substrate and prior to coupling the second surface of the buffer layer to the first surface of the insulating substrate.

12. The method of claim 7, further comprising:
    a) forming contact elements on the first circuit layer; and,
    b) separating the ICs into dies, each die comprising an IC.

13. A method for forming integrated circuits (ICs) from a semiconductor wafer including an active layer, a buffer layer for improved electrical isolation between electronic components, and a silicon substrate, a first surface of the buffer layer coupled to the active layer, and a second, opposite surface of the buffer layer coupled to the silicon substrate, comprising:

a) forming a first circuit layer of active and/or passive electronic components in the active layer of the semiconductor wafer;
b) removing the silicon substrate from the second surface of the buffer layer;
c) forming a second circuit layer of active and/or passive electronic components on a second substrate suitable for forming active and/or passive electronic components;
d) separating the second circuit layer from the second substrate;
e) coupling the second surface of the buffer layer to a first surface of an insulating substrate; and,
f) coupling the second circuit layer to a second surface of the insulated substrate.

14. The method of claim 13, wherein the insulating substrate comprises a material selected from the following types of materials: sapphire, quartz, silicon dioxide glass, aluminum nitride, hot-pressed silicon carbide ceramic, sintered silicon carbide ceramic, CVD silicon carbide, and alumina.

15. The method of claim 13, wherein the second substrate is selected from the following: a silicon-on-insulator (SOI) substrate, a silicon substrate having an insulating top layer, and a piezoelectric substrate.

16. The method of claim 15, wherein the insulating top layer comprises silicon dioxide.

17. The method of claim 13, wherein the second circuit layer comprises only at least one of the following types of electronic components: active components, passive components, opto-electronic components, microelectromechanical components, and acoustic wave components.

18. The method of claim 13, further comprising thinning the insulating substrate subsequent to coupling the second surface of the buffer layer to the first surface of the insulating substrate and prior to coupling the second circuit layer to the second surface of the insulating substrate.

19. The method of claim 13, further comprising:
a) forming contact elements on the first circuit layer; and,
b) separating the ICs into dies, each die comprising an IC.

20. A method for forming integrated circuits (ICs) from a semiconductor wafer including an active layer, a buffer layer for improved electrical isolation between electronic components, and a silicon substrate, a first surface of the buffer layer coupled to the active layer, and a second, opposite surface of the buffer layer coupled to the silicon substrate, comprising:
a) forming a first circuit layer of active and/or passive electronic components in the active layer of the semiconductor wafer;
b) removing the silicon substrate from the second surface of the buffer layer;
c) forming a second circuit layer of active and/or passive electronic components on a second substrate suitable for forming active and/or passive electronic components;
d) separating the second circuit layer from the second substrate;
e) coupling the second circuit layer to a second surface of an insulating substrate; and,
f) after coupling the second circuit layer to the second surface of the insulating substrate, coupling the second surface of the buffer layer to a first surface of the insulating substrate.

21. The method of claim 20, wherein the insulating substrate comprises a material selected from the following types of materials: sapphire, quartz, silicon dioxide glass, aluminum nitride, hot-pressed silicon carbide ceramic, sintered silicon carbide ceramic, CVD silicon carbide, and alumina.

22. The method of claim 20, wherein the second substrate is selected from the following: a silicon-on-insulator (SOI) substrate, a silicon substrate having an insulating top layer, and a piezoelectric substrate.

23. The method of claim 22, wherein the insulating top layer comprises silicon dioxide.

24. The method of claim 20, wherein the second circuit layer comprises only at least one of the following types of electronic components: components, passive components, opto-electronic components, microelectromechanical components, and acoustic wave components.

25. The method of claim 20, further thinning the insulating substrate subsequent to coupling the second circuit layer to a second surface of the insulating substrate and prior to coupling the second surface of the buffer layer to the first surface of the insulating substrate.

26. The method of claim 20, further comprising:
a) forming contact elements on the first circuit layer; and,
b) separating the ICs into dies, each die comprising an IC.

27. A method for forming integrated circuits (ICs), comprising:
a) forming buffer layer on a first substrate, the buffer layer providing improved electrical isolation between electronic components;
b) forming a first circuit layer of active and/or passive electronic components on a surface of the buffer layer;
c) separating the first circuit layer from the first substrate;
d) coupling the first circuit layer to a first surface of an insulating substrate; and
e) forming a second circuit layer of active and/or passive electronic components on a second surface of the insulating substrate suitable for forming active and/or passive electronic components.

28. The method of claim 27 wherein the first substrate comprises a silicon substrate, and wherein separating the first circuit layer from the first substrate comprises thinning the silicon substrate.

29. The method of claim 27, wherein the insulating substrate comprises a material selected from the following types of materials: sapphire, quartz, silicon dioxide glass, aluminum nitride, hot-pressed silicon carbide ceramic, sintered silicon carbide ceramic, CVD silicon carbide, and alumina.

30. The method of claim 27, wherein the forming second circuit layer on a second surface of the insulating substrate is performed prior to coupling the first circuit layer to the first surface of the insulating substrate.

31. A method for forming integrated circuits (ICs) comprising:
a) forming a buffer layer on a first substrate, the buffer layer providing improved electrical isolation between electronic components;
b) forming a first circuit layer of active and/or passive electronic components on a surface of the buffer layer;
c) separating the first circuit layer from the first substrate;
d) forming a second circuit layer of active and/or passive electronic components on a second substrate suitable for forming active and/or passive electronic components;
e) separating the second circuit layer from the second substrate;
f) coupling the first circuit layer to a first surface of an insulating substrate; and, g) coupling the second circuit layer to a second surface of the insulating substrate.

32. The method of claim 31, wherein the first substrate comprises a silicon substrate, and wherein the separating the first circuit layer from the first substrate comprises thinning the silicon substrate.

33. The method of claim 31 wherein the first substrate comprises a silicon-on-insulator (SOI) substrate.

34. The method of claim 31, wherein the second substrate is selected from the following: a silicon-on-insulator (SOI) substrate, a silicon substrate having an insulating top layer, and a piezoelectric substrate.

35. The method of claim 31, wherein the insulating substrate comprises a material selected from the following types of materials: sapphire, quartz, silicon dioxide glass, aluminum nitride, hot-pressed silicon carbide ceramic, sintered silicon carbide ceramic, CVD silicon carbide, and alumina.

36. The method of claim 31, wherein coupling of the second circuit layer to the second surface of the insulating substrate is performed prior to coupling of the first circuit layer to the first surface of the insulating substrate.

37. A method for forming integrated circuits (ICs) from a silicon-on-sapphire (SOS) wafer including an active layer and a sapphire substrate, the active layer coupled to a first surface of the sapphire substrate, comprising:

a) forming a first circuit layer of active and/or passive electronic components on an active layer of the SOS wafer;

b) forming a second circuit layer of active and/or passive electronic components on a separate substrate suitable for forming active and/or passive electronic components;

c) separating the second circuit layer from the separate substrate; and d) coupling the second circuit layer to a second surface of the sapphire substrate.

* * * * *